US009543178B2

(12) United States Patent
Lee et al.

(10) Patent No.: US 9,543,178 B2
(45) Date of Patent: Jan. 10, 2017

(54) SEMICONDUCTOR WAFER STOCKER APPARATUS AND WAFER TRANSFERRING METHODS USING THE SAME

(71) Applicant: Samsung Electronics Co., Ltd., Suwon-si, Gyeonggi-do (KR)

(72) Inventors: Hyun-Woo Lee, Hwaseong-si (KR); Chang-Woo Son, Suwon-si (KR); Yong-Jun Ahn, Suwon-si (KR); Tai-Jo Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/602,584

(22) Filed: Jan. 22, 2015

(65) Prior Publication Data
US 2016/0035607 A1   Feb. 4, 2016

(30) Foreign Application Priority Data
Jul. 30, 2014   (KR) ........................ 10-2014-0097586

(51) Int. Cl.
*H01L 21/677*   (2006.01)
*H01L 21/67*   (2006.01)
*H01L 21/673*   (2006.01)

(52) U.S. Cl.
CPC ..... *H01L 21/6773* (2013.01); *H01L 21/67294* (2013.01); *H01L 21/67373* (2013.01); *H01L 21/67379* (2013.01); *H01L 21/67733* (2013.01); *H01L 21/67736* (2013.01); *H01L 21/67769* (2013.01); *H01L 21/67772* (2013.01); *H01L 21/67775* (2013.01)

(58) Field of Classification Search
CPC ........... H01L 27/6773; H01L 27/67294; H01L 27/67373; H01L 27/67379; H01L 27/67733; H01L 27/67736; H01L 27/67769; H01L 27/67772; H01L 27/67775

See application file for complete search history.

(56) References Cited

U.S. PATENT DOCUMENTS

| 4,674,940 | A | 6/1987 | Uchida et al. |
| 6,223,886 | B1 * | 5/2001 | Bonora ............... B65G 13/04 198/465.2 |

(Continued)

FOREIGN PATENT DOCUMENTS

| JP | 06-196544 | 7/1994 |
| JP | 2007-294496 | 11/2007 |

(Continued)

*Primary Examiner* — Kaitlin Joerger
(74) *Attorney, Agent, or Firm* — Myers Bigel, P.A.

(57) ABSTRACT

A semiconductor wafer stocker apparatus includes a body frame, an inlet port to load a wafer shipping box into the body frame, an outlet port to unload the wafer shipping box from the body frame, an automated transfer robot operable to convey the wafer shipping box between the inlet port and the outlet port, and a shelf module within the body frame. The shelf module includes a shelf plate configured to support the wafer shipping box. The shelf plate includes first, second, and third protruding support pins arranged to align with respective grooves in an underside of the wafer shipping box and orient the wafer shipping box with a door thereof facing away from the body frame. The first and second support pins may be closer to the body frame than the third support pin. Related apparatus and methods of operation are also discussed.

17 Claims, 19 Drawing Sheets

(56) References Cited

U.S. PATENT DOCUMENTS

| | | | | |
|---|---|---|---|---|
| 7,101,138 | B2* | 9/2006 | Fosnight | H01L 21/67706 198/597 |
| 7,523,829 | B2* | 4/2009 | Mimura | G03F 1/66 206/232 |
| 7,648,018 | B2* | 1/2010 | Inui | H01L 21/67715 198/346.2 |
| 7,917,245 | B2 | 3/2011 | Murata | |
| 8,757,955 | B2 | 6/2014 | Murata et al. | |
| 8,851,819 | B2* | 10/2014 | Kamikawa | H01L 21/67727 414/222.07 |
| 8,851,820 | B2* | 10/2014 | Bonora | H01L 21/6773 198/465.2 |
| 2002/0124960 | A1* | 9/2002 | Nakashima | C23C 16/54 156/345.31 |
| 2005/0074313 | A1 | 4/2005 | Kang et al. | |
| 2009/0162179 | A1 | 6/2009 | Hosek et al. | |
| 2011/0286819 | A1* | 11/2011 | Shibata | H01L 21/6773 414/222.02 |
| 2015/0214080 | A1* | 7/2015 | Oyama | H01L 21/6773 414/196 |
| 2015/0217339 | A1* | 8/2015 | Sakashita | H01L 21/6773 134/115 R |
| 2016/0013087 | A1* | 1/2016 | Yoshioka | H01L 21/67769 414/659 |

FOREIGN PATENT DOCUMENTS

| | | | | |
|---|---|---|---|---|
| JP | 2009-062153 | | 3/2009 | |
| JP | WO 2013150841 A1 | * | 10/2013 | H01L 21/6773 |
| KR | 1020090025755 | | 3/2009 | |

* cited by examiner

1000A

1000C

SEMICONDUCTOR WAFER STOCKER APPARATUS AND WAFER TRANSFERRING METHODS USING THE SAME

CROSS-REFERENCE TO RELATED APPLICATION

This application claims priority under 35 U.S.C. §119 to Korean Patent Application No. 10-2014-00097586 filed on Jul. 30, 2014, the disclosure of which is hereby incorporated by reference in its entirety.

BACKGROUND

Embodiments of the inventive concepts relate to stockers for stocking and transferring wafers and wafer shipping boxes in semiconductor fabrication lines, and methods of transferring the wafers and wafer shipping boxes using the stockers.

Semiconductor fabrication lines have been developed to transfer wafers and wafer shipping boxes using automatic transfer systems, and may employ a full-automatic transfer system in the long run. Both a front open shipping box (FOSB) and a front open unified pod (FOUP) have been used as transfer systems. The FOSB may not be automatically recognized in a transfer apparatus and may not be compatible with various transfer systems. Thus, the FOSB may be transferred/loaded to a dedicated transfer system by users, which may lower productivity. Also, in some existing automated transfer systems, an overhead hoist transport (OHT) configured to move a wafer shipping box upward/downward using a hoist and an overhead shuttle (OHS) configured to cause a wafer shipping box to slide in a horizontal direction can be used independently from each other.

In some existing transfer systems, wafers or a wafer shipping box may be loaded in the OHT/OHS, a stocker, and a rail-guided vehicle (RGV) in different directions, which may increase transfer time. Also, in some existing transfer systems, a wafer shipping box may be transferred in a state in which the door thereof is open and is thus may be vulnerable to pollution.

SUMMARY

Embodiments of the inventive concepts provide a wafer transfer system and a stocker used in a semiconductor fabrication line, and inlet ports, a shelf, outlet ports, and a robot arm of the stocker.

Embodiments of the inventive concepts also provide a wafer transfer method and a stocker operating method to be used in a semiconductor fabrication line.

The technical objectives of the inventive concepts are not limited to the above disclosure; other objectives may become apparent to those of ordinary skill in the art based on the following descriptions.

According to some embodiments of the inventive concepts, a semiconductor wafer stocker apparatus includes a body frame, an inlet port to load a wafer shipping box into the body frame, an outlet port to unload the wafer shipping box from the body frame, an automated transfer robot operable to convey the wafer shipping box between the inlet port and the outlet port, and a shelf module within the body frame. The shelf module includes a shelf plate configured to support the wafer shipping box. The shelf plate includes first, second, and third protruding support pins, where the first and second support pins are closer to the body frame than the third support pin.

In some embodiments, the first, second, and third support pins may be arranged to align with respective grooves in an underside of the wafer shipping box and orient the wafer shipping box with a door thereof facing away from the body frame.

In some embodiments, the first, second, and third support pins may be arranged in a triangular configuration in which the first and second support pins are equidistant from the body frame.

In some embodiments, the shelf plate may include a shelf body unit adjacent the body frame and including the first and second support pins protruding therefrom, and a plurality of shelf leg units extending from the shelf body unit away from the body frame. The third support pin may protrude from one of the shelf leg units.

In some embodiments, the shelf plate may further include a reflective alignment panel on a surface thereof opposite the first, second, and third support pins. The reflective alignment panel may have an isosceles right triangle shape such that a scan thereof is indicative of both a horizontal and vertical position of the transfer robot relative to the shelf plate.

In some embodiments, the shelf plate may further include an upper load checking reflective panel on the surface thereof including the first, second, and third support pins. The upper load checking reflective panel may indicate a presence of the wafer shipping box on the shelf plate.

In some embodiments, the shelf plate may further include a lower load checking reflective panel on the surface thereof opposite the first, second, and third support pins. The lower load checking reflective panel may indicate the presence of the wafer shipping box in combination with the upper load checking reflective panel.

In some embodiments, the inlet port may include a top and/or side opening in the body frame, an inner loading unit within the body frame, an outer loading unit external to the body frame and configured to receive the wafer shipping box from an overhead transfer vehicle with the door thereof facing away from the body frame, and a loading plate operable to move the wafer shipping box between the outer loading unit and the inner loading unit through the opening in the body frame while maintaining the door thereof facing away from the body frame.

In some embodiments, the loading plate may include protruding loading pins arranged to align with the respective grooves in the underside of the wafer shipping box and orient the wafer shipping box with the door thereof facing away from the body frame.

In some embodiments, the automated transfer robot may be operable to convey the wafer shipping box between the inlet port and the outlet port such that the door of the wafer shipping box faces away from the body frame at both the inlet port and the outlet port.

According to further embodiments of the inventive concepts, a semiconductor wafer stocker apparatus includes a body frame, an inlet port including an opening in the body frame to load a wafer shipping box into the body frame such that a door of the wafer shipping box faces away from the body frame, an outlet port to unload the wafer shipping box from the body frame, and an automated transfer robot operable to convey the wafer shipping box between the inlet port and the outlet port.

In some embodiments, the opening in the inlet port may be positioned at a top and/or side of the body frame. The inlet port may include an inner loading unit within the body frame, an outer loading unit external to the body frame and configured to receive the wafer shipping box from an overhead transfer vehicle, and a loading plate operable to move the wafer shipping box between the outer loading unit and the inner loading unit such that the door thereof faces away from the body frame.

In some embodiments, the loading plate may include protruding loading pins arranged to align with respective grooves in an underside of the wafer shipping box such that the door thereof faces away from the body frame.

In some embodiments, the apparatus may further include a shelf module within the body frame. The shelf module may include a shelf plate configured to support the wafer shipping box. The shelf plate may have support structures arranged to align with the respective grooves in the underside of the wafer shipping box such that the door thereof faces away from the body frame.

In some embodiments, the loading pins and/or the support structures may include first, second, and third support pins arranged in a triangular orientation. The first and second support pins may be closer to the body frame than the third support pin.

In some embodiments, the automated transfer robot may be operable to convey the wafer shipping box between the inlet port and the outlet port such that the door of the wafer shipping box faces away from the body frame at both the inlet port and the outlet port.

In some embodiments, the inlet port may be configured to receive the wafer shipping box from the overhead transfer vehicle with the door in a closed position and facing away from the body frame. The automated transfer robot may be operable to convey the wafer shipping box to the outlet port while maintaining the door in the closed position.

In some embodiments, the outlet port may include a door module operable to move the door of the wafer shipping box to an open position prior to unloading of the wafer shipping box from the apparatus.

In some embodiments, the outlet port may further include a stage module configured to receive the wafer shipping box from the transfer robot with the door thereof facing away from the body frame. The stage module may include a stage plate having protruding stage support pins arranged to align with the respective grooves in the underside of the wafer shipping box.

In some embodiments, the stage module may include a rotation driver operable to rotate the wafer shipping box such that the door faces toward the body frame after the door is in the open position and prior to the unloading thereof.

According to still further embodiments of the inventive concepts, a semiconductor wafer stocker apparatus includes a body frame, an inlet port to load a wafer shipping box into the body frame, an outlet port to unload the wafer shipping box from the body frame, an automated transfer robot operable to convey the wafer shipping box between the inlet port and the outlet port, and a shelf module configured to support the wafer shipping box. The shelf module includes a reflective alignment panel thereon. The reflective alignment panel has a shape such that a scan thereof is indicative of both a horizontal position and a vertical position of the transfer robot relative thereto.

In some embodiments, the shape of the reflective alignment panel may be an isosceles right triangle shape such that a path length of the scan indicates both the horizontal and vertical positions.

In some embodiments, the shelf module may further include an upper load checking reflective panel on a surface thereof opposite the reflective alignment panel. The upper load checking reflective panel may be indicative of a presence of the wafer shipping box on the shelf module based on an absence of light reflected therefrom.

In some embodiments, the shelf module may further include a lower load checking reflective panel on a surface thereof including the reflective alignment panel. The lower load checking reflective panel may be indicative of the presence of the wafer shipping box based on light reflected therefrom in combination with the absence of light reflected from the upper load checking reflective panel.

According to yet further embodiments of the inventive concepts, in a method of operating a semiconductor wafer stocker apparatus, a wafer shipping box is loaded into the apparatus via an inlet port in a body frame of the apparatus such that a door of the wafer shipping box faces away from the body frame. The wafer shipping box is supported on a shelf plate within the body frame, the shelf plate having respective support structures arranged to orient the door of the wafer shipping box away from the body frame. The wafer shipping box is conveyed from the shelf plate to an outlet port of the body frame via operation of an automated transfer robot such that the door of the wafer shipping box faces away from the body frame at the outlet port.

In some embodiments, the door of the wafer shipping box may be oriented toward the body frame at the outlet port prior to unloading the wafer shipping box from the apparatus.

In some embodiments, the wafer shipping box may be received at the inlet port from an overhead transfer vehicle with the door thereof facing away from the body frame prior to loading the wafer shipping box.

In some embodiments, the wafer shipping box may be received from the overhead transfer vehicle with the door in a closed position, and the wafer shipping box may be conveyed to the outlet port while maintaining the door in the closed position.

In some embodiments, the door of the wafer shipping box may be moved to an open position prior to orienting the door of the wafer shipping box toward the body frame.

In accordance with an aspect of the inventive concepts, a stocker includes a body frame including a central room, and a first storage region and a second storage region disposed at both sides of the central room, and the top of which is open; shelves installed in the first storage region and the second storage region and in which a wafer shipping box is loaded such that a door of the wafer shipping box faces an outer side of the body frame; inlet ports installed in an upper region of the first storage region and in which the wafer shipping box is loaded; outlet ports installed in a lower region of the second storage region, and configured to provide the wafer shipping box or wafers in the wafer shipping box to a rail-guided vehicle; and a robot arm installed in the central room and configured to transfer the wafer shipping box between the shelves, the inlet ports, and the outlet ports.

In accordance with another aspect of the inventive concepts, a stocker includes a body frame including a storage region; shelves disposed in the storage region; inlet ports installed in an upper region of the storage region; outlet ports installed in a lower region of the storage region; and a robot arm configured to transfer a wafer shipping box between the shelves, the inlet ports, and the outlet ports. The robot arm includes a first plate on which the wafer shipping box is loaded; and three first support pins. The first plate includes a plate body; and fork type plate legs extending horizontally from the plate body. One of the first support pins is disposed on the plate body, and two of the first support pins are disposed on the fork type plate legs.

In accordance with still another aspect of the inventive concepts, a stocker includes a body frame including a central room and a first storage region and a second storage region disposed at both sides of the central room, and the top of which is open; inlet ports installed in an upper region of the first storage region and configured to be provided a wafer shipping box from an overhead transfer vehicle through the open top of the body frame; a shelf configured to load and stock the wafer shipping box thereon; outlet ports configured to provide the wafer shipping box to a rail-guided vehicle; and a robot arm installed in the central room and configured to move the wafer shipping box between the inlet ports, the shelf, and the outlet ports. The shelf includes a first plate on which the wafer shipping box is loaded; an upper loading checking reflective panel disposed on the top of the shelf plate; and a lower loading checking reflective panel disposed at the bottom of the shelf plate. In accordance with yet another aspect of the inventive concepts, a stocker includes a body frame including a storage region; shelves disposed in the storage region; inlet ports installed in an upper region of the storage region; outlet ports installed in a lower region of the storage region; and a robot arm configured to transfer a wafer shipping box between the shelves, the inlet ports, and the outlet ports. The outlet ports includes a stage module on which the wafer shipping box is loaded; a door module configured to open and close a door of the wafer shipping box; and a door module controller configured to move the door module.

In accordance with yet another aspect of the inventive concepts, a method of transferring a wafer includes loading a wafer shipping box on inlet ports in a body frame such that a door of the wafer shipping box faces the outside of the body frame; loading the wafer shipping box loaded on the inlet ports on a first plate of a robot arm using the robot arm including the first plate including a plate body and plate legs extending horizontally from the plate body, such that the door of the wafer shipping box faces a direction in which the plate legs of the robot arm extends; and transferring the wafer shipping box on the first plate of the robot arm onto outlet ports such that the door of the wafer shipping box faces the outside of the body frame.

In accordance with yet another aspect of the inventive concepts, a method of transferring a wafer shipping box includes transferring and loading the wafer shipping box loaded on an inlet port onto a shelf using a robot arm; and transferring the wafer shipping box loaded on the shelf to an outlet port using the robot arm. The transferring of the wafer shipping box from the shelf onto the outlet port includes radiating light to an upper loading checking reflective panel protruding from the top of a shelf plate of the shelf from a loading checking sensor of the robot arm, and determining that the wafer shipping box is not loaded on the shelf when the light reflected from the upper loading checking reflective panel is received by the loading checking sensor.

In accordance with yet another aspect of the inventive concepts, a method of transferring a wafer includes loading a wafer shipping box on a first inlet port disposed in a stocker using a first overhead transfer vehicle through an open top of the stocker; transferring and loading the wafer shipping box loaded on the first inlet port onto a shelf; transferring and loading the wafer shipping box loaded on the shelf onto an outlet port; opening a door of the wafer shipping box loaded on the outlet port; and transferring wafers present in the wafer shipping box to a unit process apparatus using a rail-guided vehicle.

Details of other embodiments are disclosed in the detailed description and drawings appended herein.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
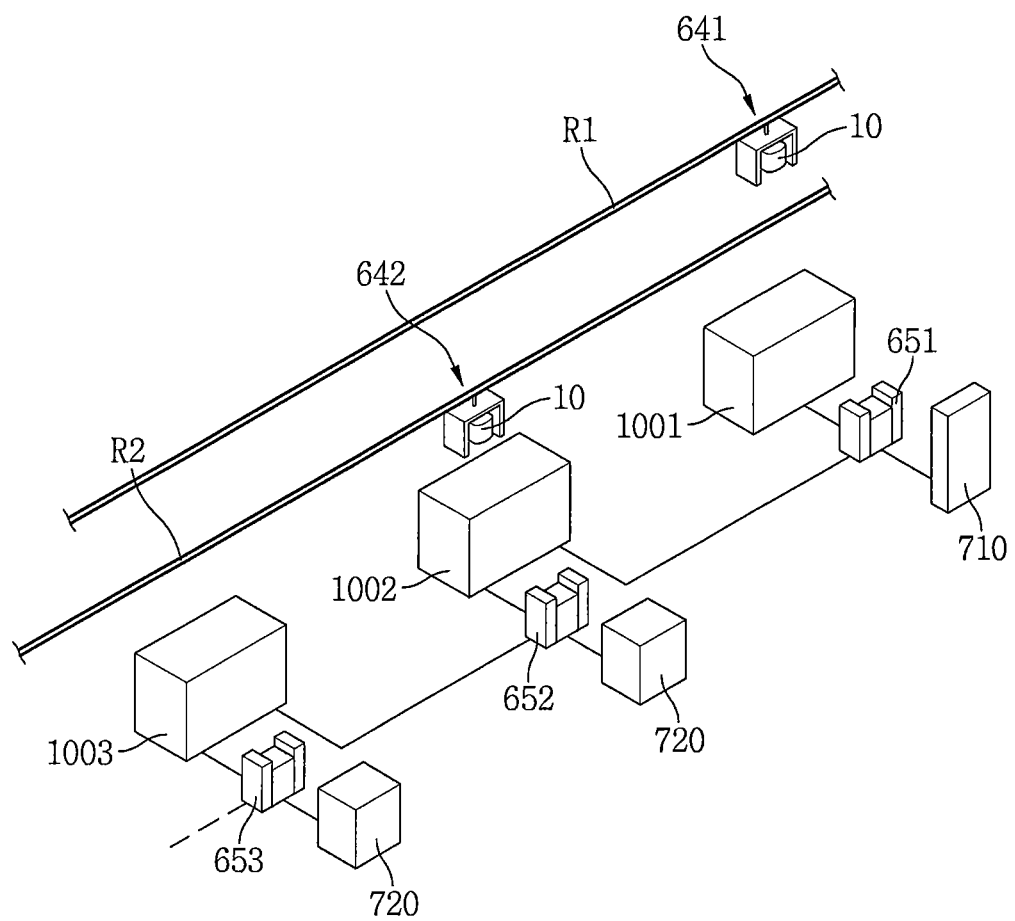
FIG. 1 is a schematic block diagram of an apparatus structure of a semiconductor fabrication line in accordance with some embodiments of the inventive concepts.

Particular structural and functional descriptions regarding embodiments of the inventive concepts set forth herein are simply provided to explain these embodiments. Thus, the inventive concepts may be accomplished in other various embodiments and should not be construed as limited to the embodiments set forth herein.

The inventive concepts may be embodied in different and various forms, and particular embodiments of the inventive concepts will thus be illustrated in the drawings and described in the present disclosure in detail. However, the inventive concepts are not limited to the particular embodiments and should be construed as covering all of modifications, equivalents, and substitutes thereof.

It will be understood that, although the terms 'first,' 'second,' 'third,' etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. For example, a first element, component, region, layer, or section discussed below could be termed a second element, component, region, layer, or section without departing from the scope of the inventive concepts. Similarly, a second element, component, region, layer, or section discussed below could be termed a first element, component, region, layer, or section It will be understood that when an element or layer is referred to as being "connected to" or "coupled to" another element or layer, it can be directly connected to or coupled to the other element or layer or intervening elements or layers may be present. In contrast, when an element or layer is referred to as being "directly connected to" or "directly coupled to" another element or layer, there are no intervening elements or layers present. Other expressions describing the relations among constitutional elements, e.g., "between" and "directly between," or "adjacent to" and "directly adjacent to," may be similarly construed.

The terminology used herein is for the purpose of describing particular embodiments only and is not intended to be limiting of the inventive concepts. As used herein, singular forms are intended to include plural forms as well, unless the context clearly indicates otherwise. It will be further understood that the terms "comprise" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an embodiment of the inventive concept may be accomplished in different ways, a function or an operation specified in a particular block may be performed in an order that is different from that illustrated in a flowchart. For example, functions or operations specified in sequential blocks may be substantially simultaneously performed, or may be performed in a reverse order according to related functions or operations.

FIG. 1 is a schematic block diagram of an apparatus structure of a semiconductor fabrication line in accordance with some embodiments of the inventive concepts.

Referring to FIG. 1, the semiconductor fabrication line in accordance with some embodiments of the inventive concepts may include a first overhead transfer vehicle 641, a second overhead transfer vehicle 642, first to third stockers 1001 to 1003, a labeling apparatus 710, unit process apparatuses 720, and first to third rail-guided vehicles 651 to 653.

The first overhead transfer vehicle 641 and the second overhead transfer vehicle 642 may transfer wafer shipping boxes 10 in a wafer processing line and/or an EDS line. For example, the first overhead transfer vehicle 641 may include an overhead hoist transport (OHT), and the second overhead transfer vehicle 642 may include an OHT or an overhead shuttle (OHS). The wafer shipping boxes 10 may each include a box in which wafers are loaded, such as a front open shipping box (FOSB) or a front open unified pod (FOUP). The first overhead transfer vehicle 641 may move along a first overhead rail R1, and the second overhead transfer vehicle 642 may move along a second overhead rail R2. For example, the first overhead rail R1 may be coupled to the wafer processing line, and the second overhead rail R2 may be installed only in the EDS line. Thus, the first overhead transfer vehicle 641 may transfer the wafer shipping boxes 10 from the wafer processing line, and the second overhead transfer vehicle 642 may transfer the wafer shipping boxes 10 from the inside of the EDS line.

The first stocker 1001 may receive, load, and stock the wafer shipping boxes 10 transferred from the first overhead transfer vehicle 641 or the second overhead transfer vehicle 642. The first stocker 1001 may provide the wafer shipping boxes 10 to the first rail-guided vehicle 651.

The first rail-guided vehicle 651 may transfer the wafer shipping boxes 10 to the labeling apparatus 710 from the first stocker 1001, and transfer the wafer shipping boxes 10 to the first stocker 1001 or the second stocker 1002 from the labeling apparatus 710.

The labeling apparatus 710 may label the wafer shipping boxes 10 or wafers in the wafer shipping boxes 10 with identification (ID) code. For example, the labeling apparatus 710 may record radio-frequency ID (RFID) or a bar code tag on the wafer shipping boxes 10 or the wafers or attach the RFID or the bar code tag to the wafer shipping boxes 10 or the wafers.

The second stocker 1002 may receive, load, and stock the wafer shipping boxes 10 transferred from the first rail-guided vehicle 651, the first overhead transfer vehicle 641, and/or the second overhead transfer vehicle 642. The second stocker 1002 may provide the wafer shipping boxes 10 or the wafers in the wafer shipping box 10 to the second rail-guided vehicle 652.

The second rail-guided vehicle 652 may transfer the wafer shipping boxes 10 loaded in the second stocker 1002 or wafers one by one to the unit process apparatus 720, and transfer the wafer shipping boxes 10 or the wafers from the unit process apparatus 720 to the third stocker 1003. The unit process apparatus 720 may include an electric test apparatus, a laser repair apparatus, a grinding apparatus, an inking apparatus, or the like.

The third stocker 1003 may receive, load, and stock the wafer shipping boxes 10 or the wafers transferred from the second rail-guided vehicle 652. The third stocker 1003 may provide the wafer shipping boxes 10 or the wafers in the wafer shipping boxes 10 to the third rail-guided vehicle 653.

The third rail-guided vehicle 653 may transfer the wafer shipping boxes 10 loaded in the third stocker 1003 or wafers to another unit process apparatus 720 or another apparatus. For example, the rail-guided vehicles 651 to 653 may transfer the wafer shipping boxes 10 or the wafer between the stockers 1001 to 1003 and the unit process apparatuses 720.

FIGS. 2A to 2D are schematic three-dimensional (3D) views of stockers in accordance with various embodiments of the inventive concepts.

Figure 2A:
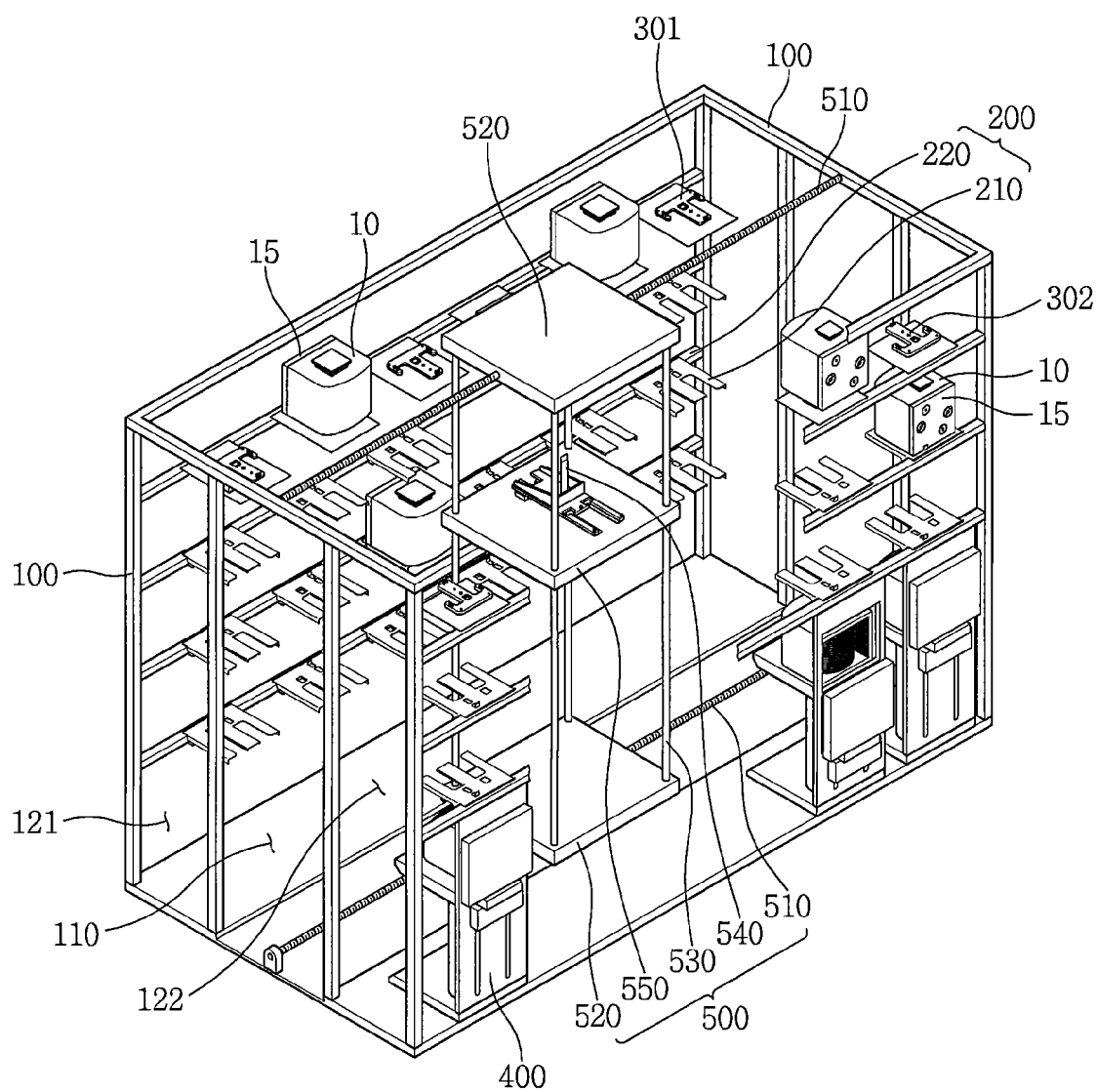
FIGS. 2A to 2C are schematic three-dimensional (3D) views of stockers in accordance with various embodiments of the inventive concepts.

Referring to FIG. 2A, a stocker 1000A in accordance with some embodiments of the inventive concepts may include a body frame 10Q, shelf modules 200, inlet ports 301 and 302, outlet ports 400, and a crane 500.

The body frame 100 may form the frame or exterior of the stocker 1000A and may have a hexagonal or other shape, the top and side surfaces of which are open. A central room or chamber 110 through which the crane 500 is moved is included in the body frame 100. A first storage region 121 and a second storage region 122 may be formed at both sides of the central room 110.

Wafer shipping boxes 10 may be loaded in the shelf modules 200. The shelf modules 200 may include shelf frames 220 combined with a plurality of shelves 210. The shelf modules 200 may be formed in a multi-story form. The wafer shipping boxes 10 may be loaded in the shelf modules 200 such that doors 15 of the wafer shipping boxes 10 face an outer side of or away from the body frame 100.

The inlet ports 301 and 302 may include a first inlet port 301 disposed in an uppermost region of the first storage region 121, and a second inlet port 302 disposed in an uppermost region of the second storage region 122. The first and second inlet ports 301 and 302 may be disposed in the body frame 100. The first and second inlet ports 301 and 302 may receive the wafer shipping boxes 10 from or provide the wafer shipping boxes 10 to the first overhead transfer vehicle 641 through the open top of the body frame 100, and may receive the wafer shipping boxes 10 from or provide the wafer shipping boxes 10 to the second overhead transfer vehicle 642 through the open side surfaces of the body frame 100. The first and second inlet ports 301 and 302 may receive or load the wafer shipping boxes 10 such that the doors 15 of the wafer shipping boxes 10 face an outer side of or away from the body frame 100.

The outlet ports 400 may be disposed in a lower region of the second storage region 122. The wafer shipping boxes 10 loaded in the outlet port 400 may be transferred to the wafer shipping boxes 10 through the first to third rail-guided vehicles 651 to 653. The outlet ports 400 may receive or load the wafer shipping boxes 10 such that the doors 15 of the wafer shipping boxes 10 face an outer side of or away from the body frame 100.

The crane 500 may be installed in the central room 110. The crane 500 may include horizontal rails 510 installed at the center of the bottom and top of the central room 110, plates 520 installed at the horizontal rails 510 to face each other in a vertical direction and to be movable along the horizontal rails 510 in a horizontal direction, vertical rails 530 installed vertically between the plates 520, a robot arm 540 for loading the wafer shipping boxes 10, and a transfer robot 550 moving upward/downward along the vertical rails 530, rotating the robot arm 540, and transferring and storing the wafer shipping boxes 10 by retracting/putting the robot arm 540 therein or extending/stretching out the robot arm 540 therefrom. The crane 500 may transfer the wafer shipping boxes 10 from the first and second inlet ports 301 and 302 to the shelf modules 200, from the shelf modules 200 to the outlet ports 400, from the first and second inlet ports 301 and 302 to the outlet ports 400, and/or vice versa. The robot arm 540 of the crane 500 may grab and load the wafer shipping boxes 10 such that the doors 15 of the wafer shipping boxes 10 face an outer side of or away from the body frame 100.

Figure 2B:
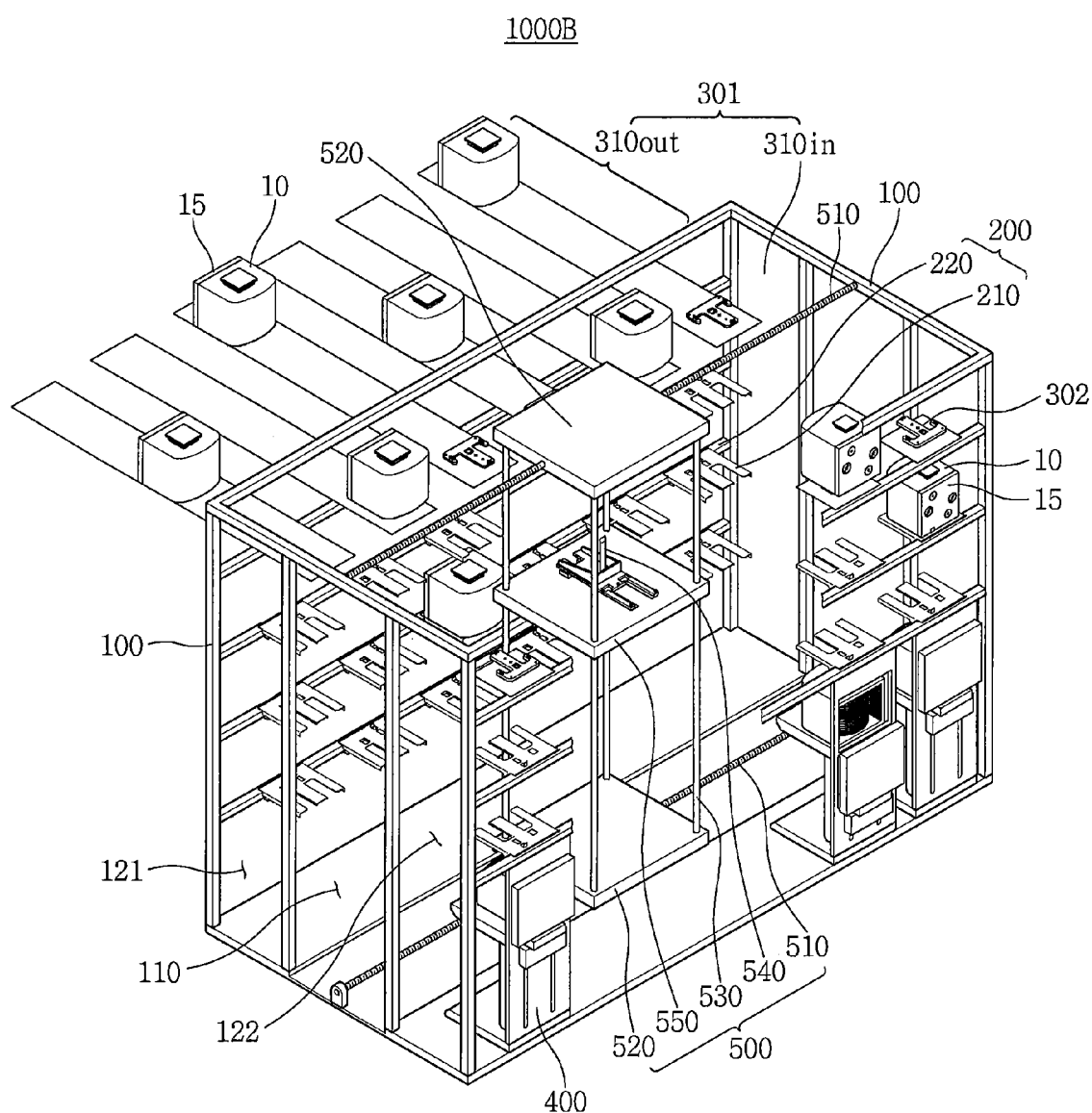

Referring to FIG. 2B, a stocker 1000B in accordance with another embodiment of the inventive concepts may include first inlet ports 301 each including an inner loading unit 310in and outer loading unit 310out, compared to the stocker 1000A of FIG. 2A. The inner loading unit 310in may be disposed within the body frame 100. For example, the inner loading unit 310in may be disposed in an uppermost region of a first storage region 121. Thus, the inner loading unit 310in may receive wafer shipping boxes 10 from the first overhead transfer vehicle 641 and/or the second overhead transfer vehicle 642, or provide the wafer shipping boxes 10 to the first overhead transfer vehicle 641 and/or the second overhead transfer vehicle 642 through an open top of a body frame 100. The outer loading unit 310out may extend from the inner loading unit 310in to outside of the body frame 100. For example, the outer loading unit 310out may include two loading regions. The two loading regions may be used exclusively by the first overhead transfer vehicle 641 and the second overhead transfer vehicle 642, respectively.

Figure 2C:
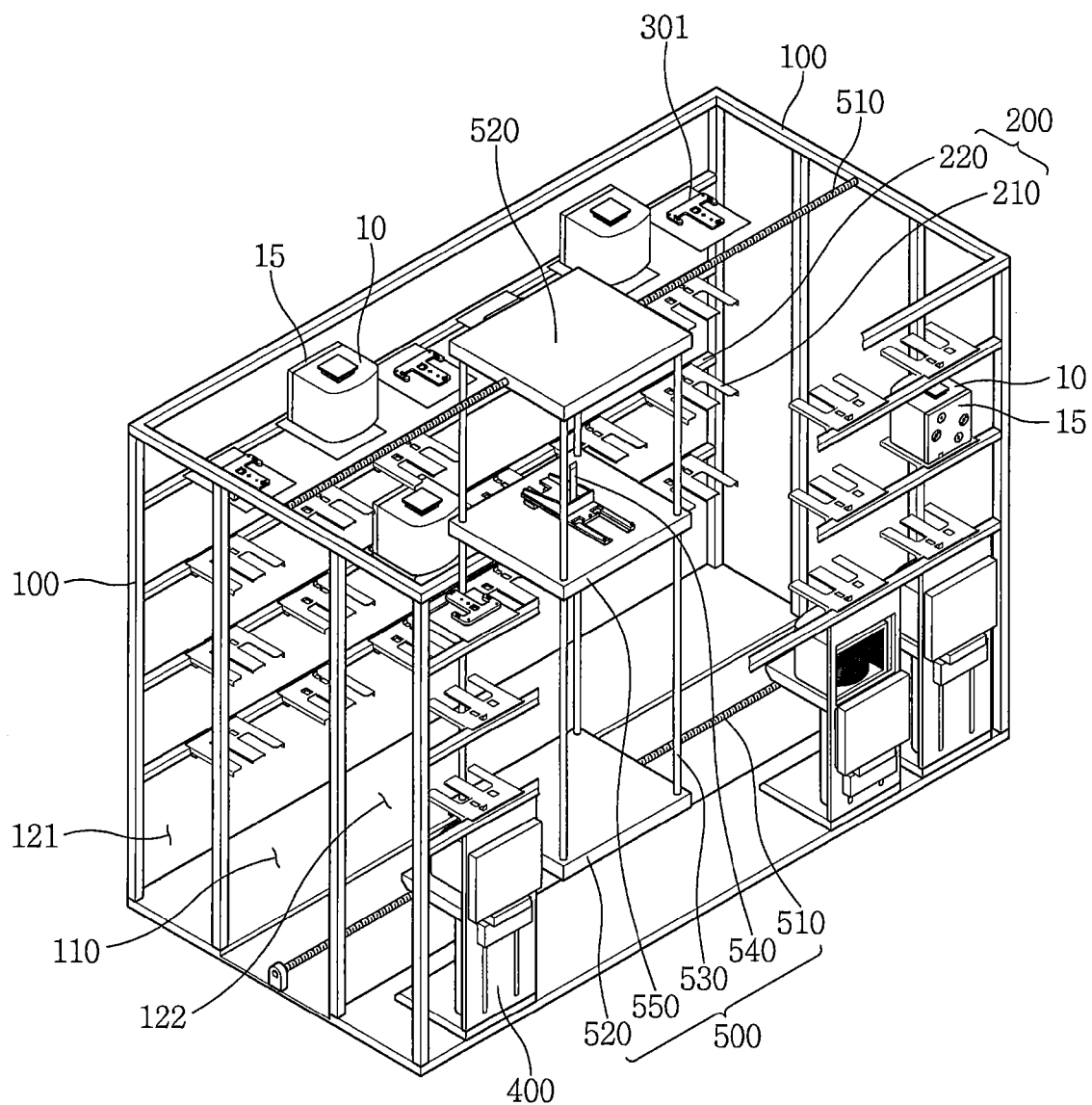

Referring to FIG. 2C, a stocker 1000C in accordance with another embodiment of the inventive concepts may include only first inlet ports 301, compared to the stockers 1000A and 1000B of FIGS. 2A and 2B. For example, the second inlet ports 302 of FIGS. 2A and 2B may be omitted. The first inlet ports 301 may be disposed in an uppermost region of a first storage region 121 in a body frame 100.

Figure 3A:
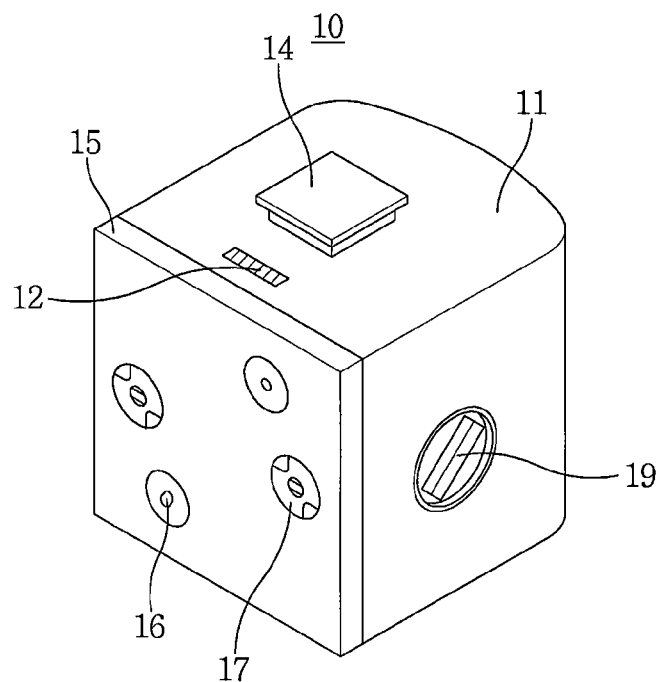
FIG. 3A is a schematic 3D view of a wafer shipping box in accordance with some embodiments of the inventive concepts.
Figure 3B:
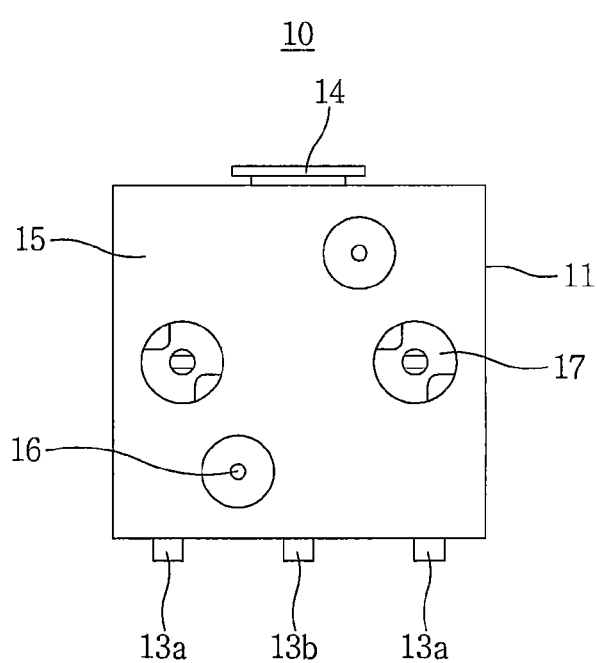
FIG. 3B is a schematic front view of the wafer shipping box.
Figure 3C:
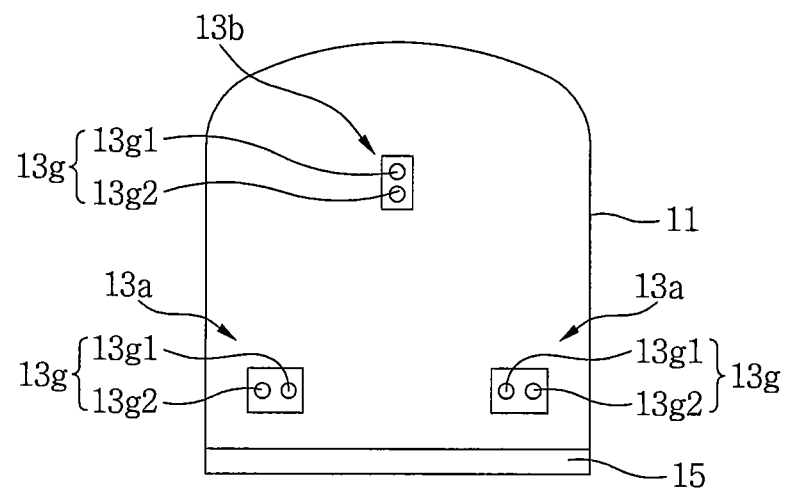
FIG. 3C is a schematic bottom view of the wafer shipping box.
Figure 3D:
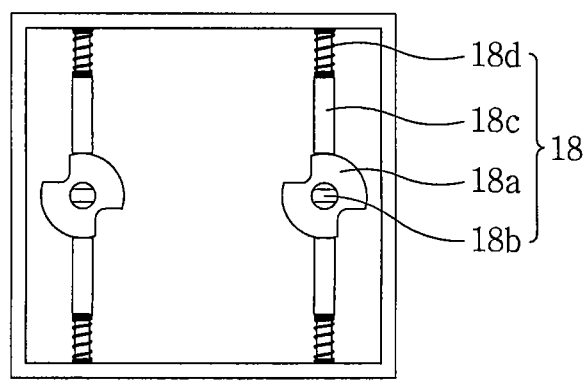
FIG. 3D is a schematic projection view of the inside of a door of the wafer shipping box.

The stockers 1000A, 1000B, and 1000C may be used in various combinations. The first to third stockers 1001 to 1003 of FIG. 1 may include one or more of the stockers 1000A to 1000C FIG. 3A is a schematic 3D view of a wafer shipping box 10 in accordance with some embodiments of the inventive concepts. FIG. 3B is a schematic front view of the wafer shipping box 10. FIG. 3C is a schematic bottom view of the wafer shipping box 10. FIG. 3D is a schematic projection view of the inside of a door 15 of the wafer shipping box 10.

Referring to FIGS. 3A to 3C, the wafer shipping box 10 in accordance with some embodiments of the inventive concepts may include a case or housing 11 and the door 15. The wafer shipping box 10 may include a FOSB or a FOUP.

A space for accommodating wafers is formed in the case 11. On the top of the case 11, a flange 14 combined with overhead transfer vehicles 641 and 642 and an ID tag 12 recorded thereon ID of the wafer shipping boxes 10 may be installed. The ID tag 12 may be installed in front of or behind the flange 14. The ID tag 12 may include a barcode tag or an RFID tag. The ID tag 12 may be also installed in upper region of a rear surface of the case 11 or a lower surface of an inner side of the case 11. A rotatable handle 19 may be further installed on an outer side surface of the case 11.

A plurality of supporters or supports 13a and 13b may be disposed at the bottom of the case 11. For example, the supports 13a and 13b may include two front supports 13a disposed adjacent to both sides of the door 15 and the case 11, and one rear support 13b disposed adjacent to the center of a rear surface of the case 11. The supports 13a and 13b may include grooves 13g. The grooves 13g may include first sub-grooves 13g1 and second sub-grooves 13g2. The first sub-grooves 13g1 and the second sub-grooves 13g2 may be used to be aligned with various loading apparatuses. For example, a first loading apparatus may be combined with the first sub-grooves 13g1 and a second loading apparatus may be combined with the second sub-grooves 13g2.

The door 15 may open or close one surface of the case 11. In an outer surface of the case 11, pin holes 16 may be formed to a predetermined depth and lock holes 17 may be formed to open the inside of the door 15. Door locks 18 may be installed within the door 15. For example, as illustrated in FIG. 3D, the door locks 18 are installed in regions that are opened by the lock holes 17 of the door 15, and may each include a round rotor 18a having concave grooves in opposite regions on a circumference thereof, latches 18c installed in upper and lower regions of the door 15 around the rotor 18a in a vertical axis direction and each having one end in contact with the circumference of the rotor 18a and the other end combined with the case 11, and elastic springs 18d installed the other ends of the latches 18c to apply an elastic force to the latches 18c. Key holes 18b may be formed in central regions of the rotors 18a. While the door 15 is locked in the case 11, the one ends of the latches 18c are disposed on the circumference of the rotor 18a and the other ends of the latches 18c are combined with the case 11. When keys are inserted into the key holes 18b to rotate the rotor 18a, the one ends of the latches 18c are moved from the circumference of the rotor 18a to the concave grooves, and the other ends of the latches 18c are separated from the case 11 due to an elastic force applied from the elastic springs 18d.

Figure 4A:
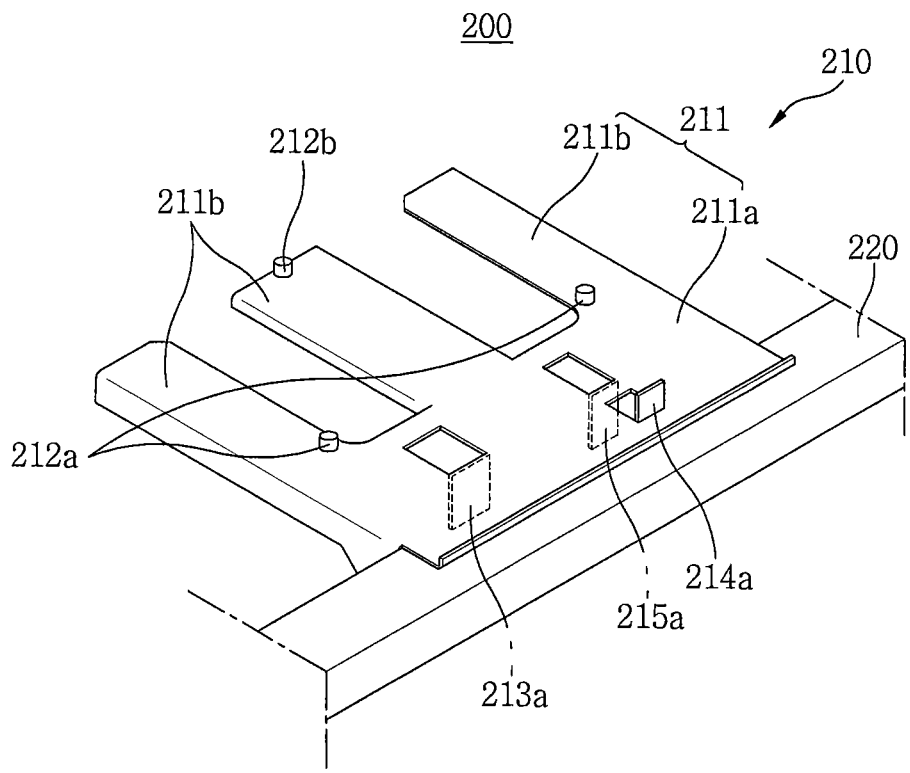
FIG. 4A is a schematic 3D view of a shelf of a shelf module.
Figure 4B:
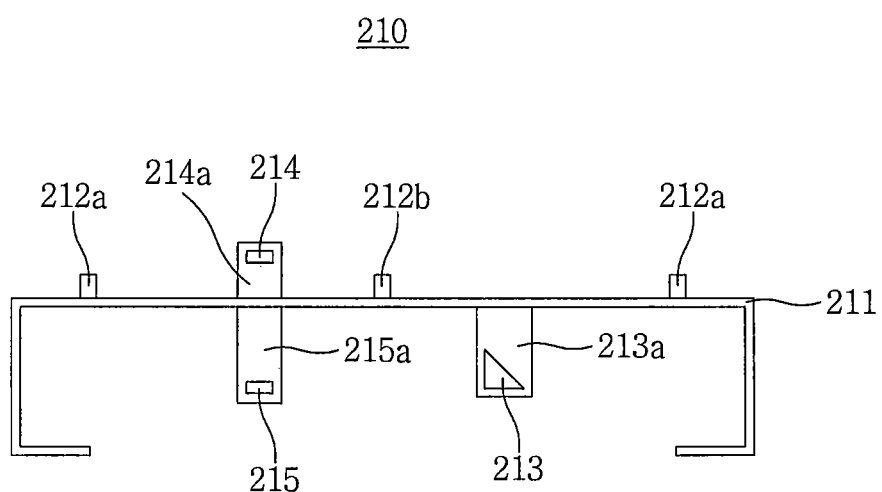
FIG. 4B is a schematic front view of the shelf when viewed from a crane alongside the shelf.

FIG. 4A is a schematic 3D view of the shelf 210 of the shelf module 200. FIG. 4B is a schematic front view of the shelf 210 when viewed from the crane 500 alongside the shelf 210.

Referring to FIGS. 4A and 4B, the shelf 210 may include a shelf plate 211, front/rear shelf support pins 212a and 212b, an auto-teaching reflective panel 213, an upper loading checking reflective panel 214, and a lower loading checking reflective panel 215.

The shelf plate 211 may have a fork shape for mounting wafer shipping boxes 10. The shelf plate 211 may include a shelf body unit 211a coupled to the shelf frame 220, and shelf leg units 211b extending from the shelf body unit 211a.

The front/rear shelf support pins 212a and 212b may guide and support loaded wafer shipping boxes 10 to be present at a normal or desired position. The front/rear shelf support pins 212a and 212b are arranged in a triangular configuration, with the front support pins 212a closer to the frame 220 than the rear support pin 212b, and may protrude and/or may otherwise be arranged to be inserted into the grooves 13g of the front/rear supports 13a and 13b of the case 11 of the wafer shipping box 10. For example, the front shelf support pins 212a may be installed on the shelf body unit 211a and aligned to be inserted into the second sub-grooves 13g2 of the front supports 13a, and one rear shelf support pin 212b may be installed on a central shelf leg unit 211b and aligned to be inserted into the second sub-groove 13g2 of the rear support 13b. Since the shelf body unit 211a is coupled to the shelf frame 220, the wafer shipping box 10 may be loaded on the shelf 210 such that the door 15 faces the outside of or away from the body frame 100.

The auto-teaching reflective alignment panel 213 may be installed on an auto-teaching plate 213a protruding from the bottom of the shelf body unit 211a. The auto-teaching reflective panel 213 may be used to auto-teach alignment of the shelf 210 and the crane 500 so that the crane 500 may exactly approach a loading/unloading position when the wafer shipping box 10 is loaded on or unloaded from the shelf 210. The auto-teaching reflective panel 213 may have a right-angled isosceles triangular shape.

The upper loading checking reflective panel 214 may be installed on an upper loading checking plate 214a protruding from the top of the shelf body unit 211a. The upper loading checking reflective panel 214 may be used to determine whether the wafer shipping box 10 is loaded on the shelf 210. For example, when the wafer shipping box 10 is presently loaded on the shelf 210, the upper loading checking reflective panel 214 may be hidden by the wafer shipping box 10 such that a signal and location of the upper loading checking reflective panel 214 may not be sensed.

The lower loading checking reflective panel 215 may be installed on a lower loading checking plate 215a protruding from the bottom of the shelf body unit 211a. The lower loading checking reflective panel 215 may be used to determine whether the wafer shipping box 10 is loaded on the shelf 210 when a signal or location of the upper loading checking reflective panel 214 is not sensed. Since the lower loading checking reflective panel 215 is present at the bottom of the shelf plate 211, the lower loading checking reflective panel 215 is not hidden even when the wafer shipping box 10 is loaded on the shelf 210. Thus, a signal and location of the lower loading checking reflective panel 215 may be continuously sensed.

Figure 5A:
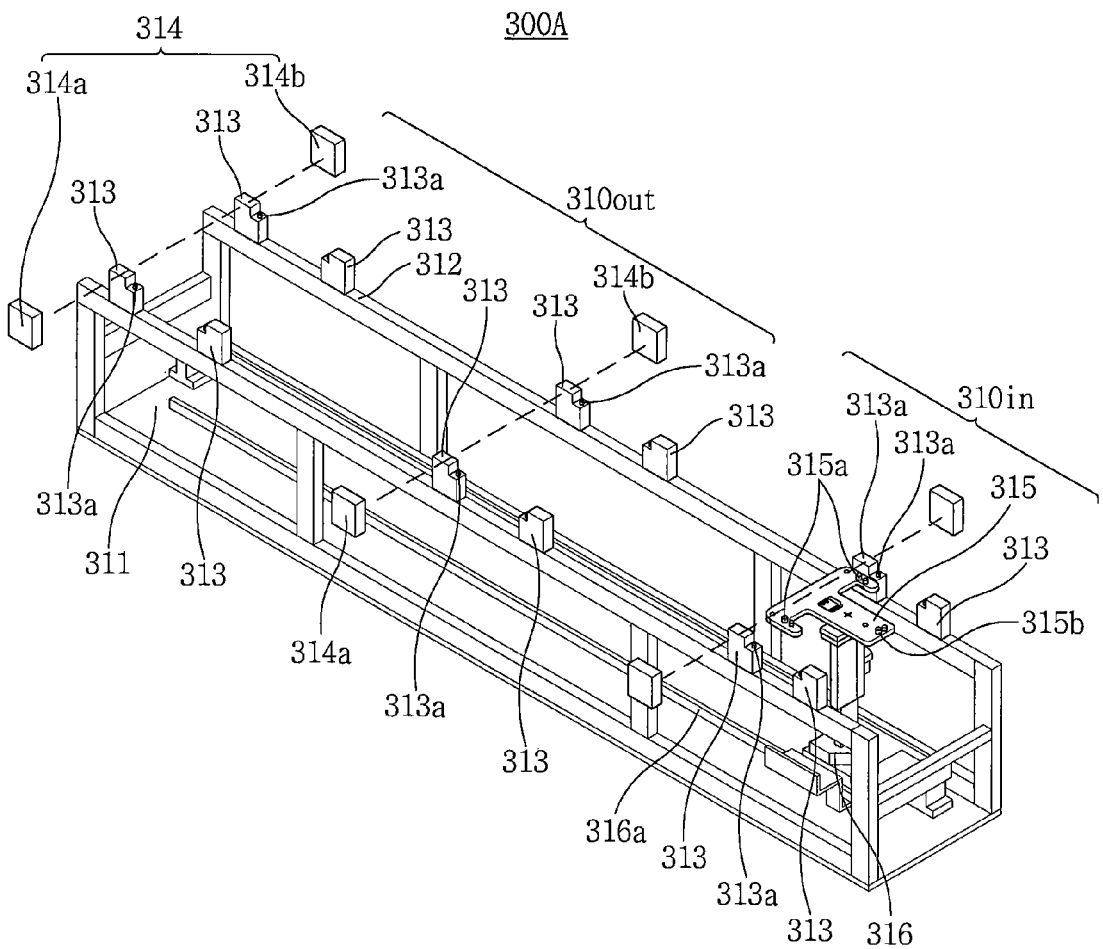
FIG. 5A is a schematic 3D view of an inlet port in accordance with some embodiments of the inventive concepts.
Figure 5B:
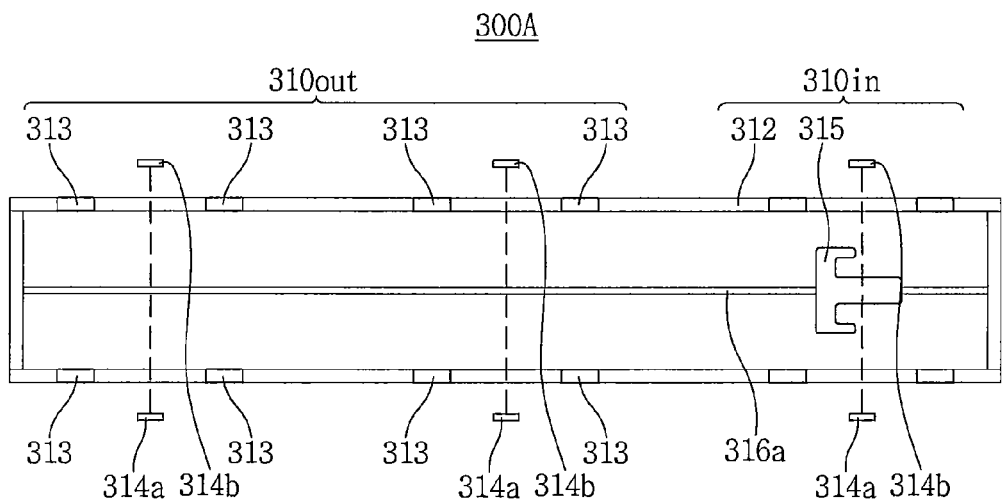
FIG. 5B is a schematic 3D top view of the inlet port.
Figure 5C:
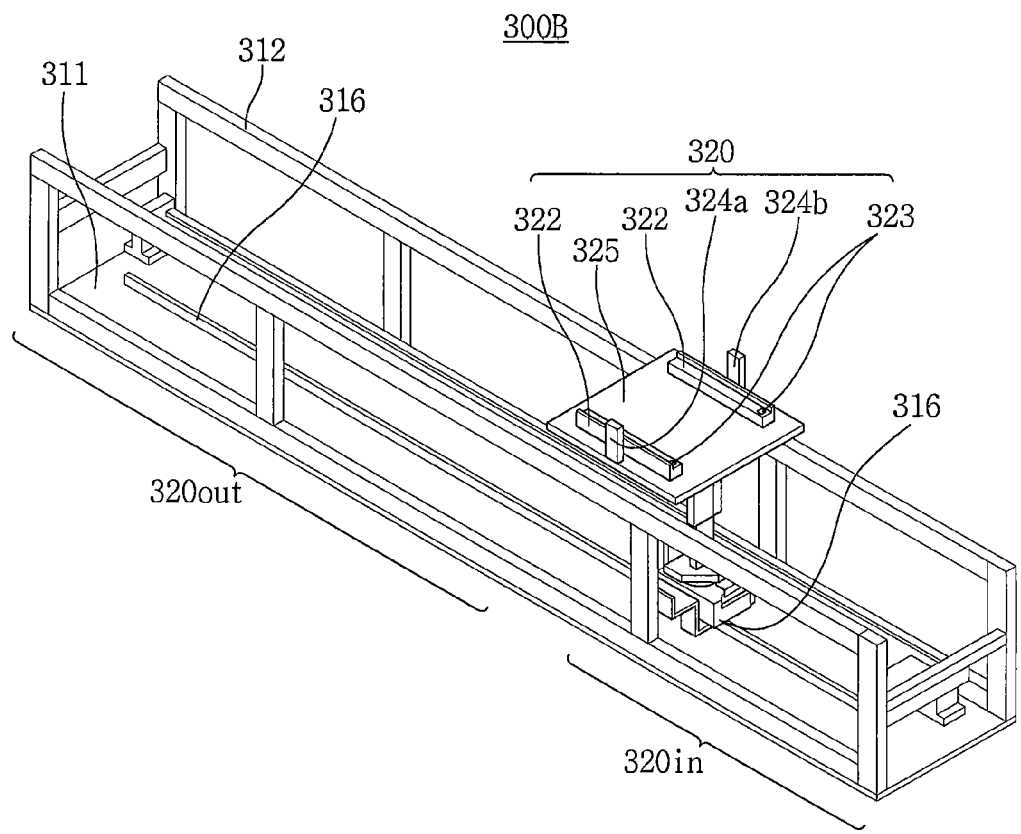
FIGS. 5C and 5D are schematic 3D views of inlet ports in accordance with other embodiments of the inventive concepts.
Figure 5D:
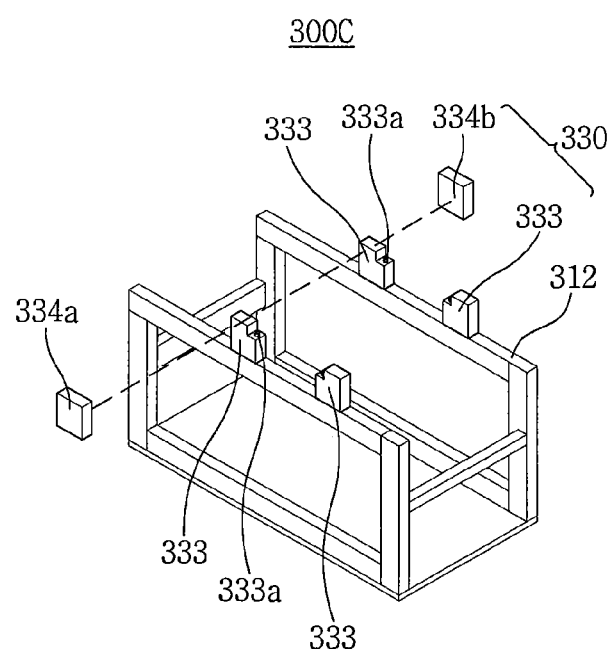

FIG. 5A is a schematic 3D view of an inlet port 300A in accordance with some embodiments of the inventive concepts. FIG. 5B is a schematic 3D top view of the inlet port 300A. FIGS. 5C and 5D are schematic 3D views of inlet ports 300B and 300C in accordance with other embodiments of the inventive concepts. The first and second inlet ports 301 and 302 include the inlet ports 300A to 300C.

Referring to FIGS. 5A and 5B, the inlet port 300A may include an inlet plate 311, inlet frames 312, inner loading units 310in, outer loading units 310out, a loading plate 315, a driver 316, and a transfer rail 316a.

The inlet plate 311 may form a lower body of the inlet port 300, and the inlet frames 312 may form a sidewall body of the inlet port 300.

The inner loading units 310in and the outer loading unit 310out may be disposed on the inlet plate 311 and/or the inlet frame 312. For example, the inner loading units 310in may be present within the body frame 100, and the outer loading unit 310out may be present outside the body frame 100. The inner loading unit 310in and the outer loading unit 310out may each include guide pins 313, loading sensors 313a, a light-emitting element 314a, and a light-receiving element 314b.

The guide pins 313 may be installed on the inlet frame 312 to support the wafer shipping boxes 10 loaded from the overhead transfer vehicles 641 and 642. For example, the guide pins 313 may be arranged such that a set of four guide pins 313 is disposed on each of the inner loading units 310in and the outer loading units 310a, The guide pins 313 may have a step form to support the corners of the case 11 of the wafer shipping box 10.

The loading sensors 313a are installed in at least two guide pins 313 and may sense whether the wafer shipping boxes 10 are loaded on the guide pins 313. The first loading sensors 313a may include a contact sensor to sense whether the wafer shipping boxes 10 are loaded while in contact with bottom surfaces of the wafer shipping boxes 10.

The light-emitting element 314a and the light-receiving element 314b may be installed at both sides of the guide pins 313 to detect whether the wafer shipping boxes 10 are loaded on the guide pins 313. The light-emitting element 314a and the light-receiving element 314b may be installed at respective locations such that a light path therebetween passes through the wafer shipping box 10 loaded on the guide pins 313, and may detect the presence of the wafer shipping boxes 10 by determining whether light emitted from the light-emitting element 314a is received by the light-receiving element 314b.

The loading plate 315 may transfer the wafer shipping box 10 while moving between the inner loading unit 310in and the outer loading unit 310a. For example, the loading plate 315 may fetch the wafer shipping boxes 10 loaded on the outer loading units 310a to the inner loading unit 310in. The loading plate 315 may make an upward/downward movement. For example, the loading plate 315 may have a T-shape, a Π-shape or a 3-finger fork shape. The loading plate 315 may include front/rear plate pins 315a and 315b (also referred to herein as loading pins) arranged to be aligned and coupled to the front/rear supports 13a and 13b of the case 11 of the wafer shipping box 10. The front/rear plate pins 315a and 315b may be aligned to be inserted into the second sub-grooves 13g2 of the front/rear supports 13a and 13b. The loading plate 315 may further include a contact sensor and/or a proximity sensor for sensing whether the wafer shipping box 10 is loaded.

The driver 316 may horizontally move the loading plate 315 along the inlet plate 311 and the inlet frames 312 and/or move the loading plate 315 upward/downward.

The transfer rail 316a is installed on the inlet plate 311 and may guide moving paths of the driver 316 and/or the loading plate 315.

Referring to FIG. 5C, the inlet port 300B in accordance with other embodiments of the inventive concepts may include a movable loading unit 320. The movable loading unit 320 may include support guides 322 on a loading plate 325. The movable loading unit 320 may further include loading sensors 323 in the support guides 322 on the loading plate 325, a light-emitting element 324a and a light-receiving element 324b next to the support guide 322, a driver 316, and a transfer rail 316a. The wafer shipping box 10 may be directly loaded to the movable loading unit 320 while the movable loading unit 320 moves along the inlet frame 312 between an inner loading region 320in and an outer loading region 320out.

Referring to FIG. 5D, the inlet port 300C in accordance with other embodiments of the inventive concepts may include a fixed loading unit 330. The fixed loading unit 330 may include support guides 333 on the inlet frame 312. The fixed loading unit 330 may further include loading sensors 333a in the support guides 333 on the inlet frame 312, and a light-emitting element 334a and a light-receiving element 334b next to the support guides 333. The inlet port 300C may be disposed in the first storage region 121 in the body frame 100.

Figure 6A:
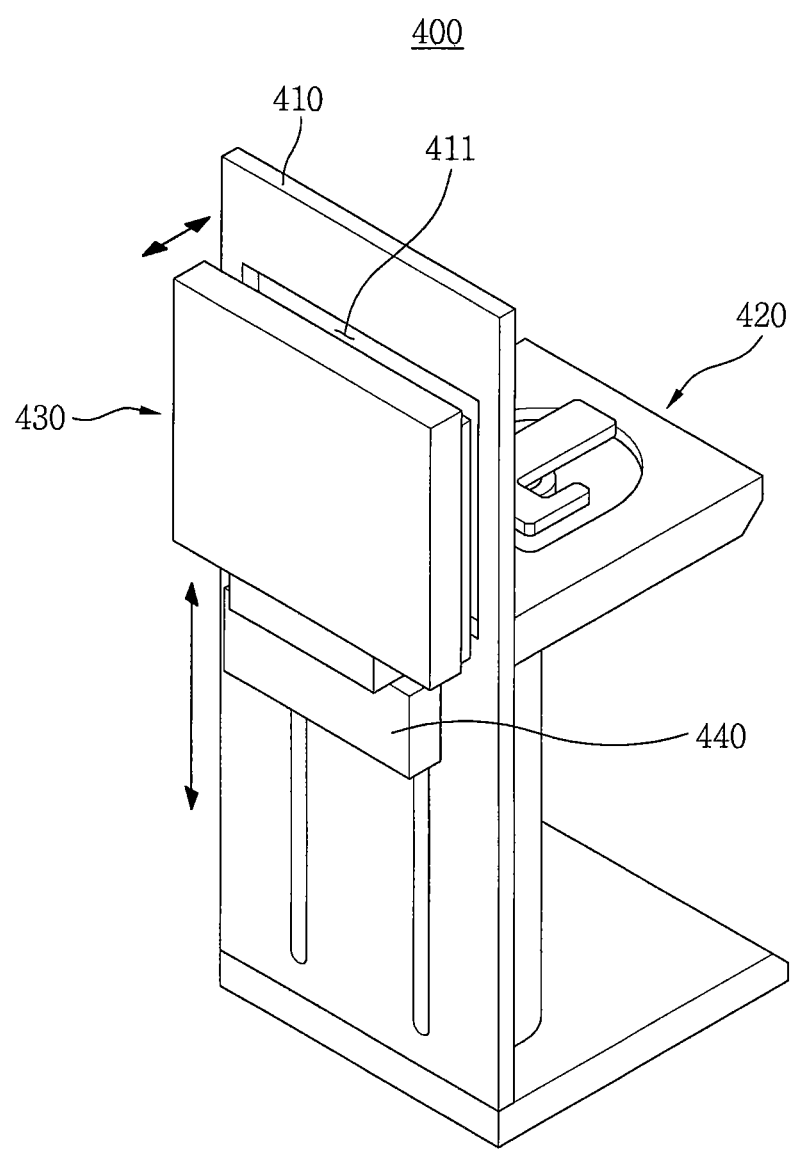
FIG. 6A is a schematic 3D view of an outlet port when viewed from the outside of the body frame in accordance with some embodiments of the inventive concepts.
Figure 6B:
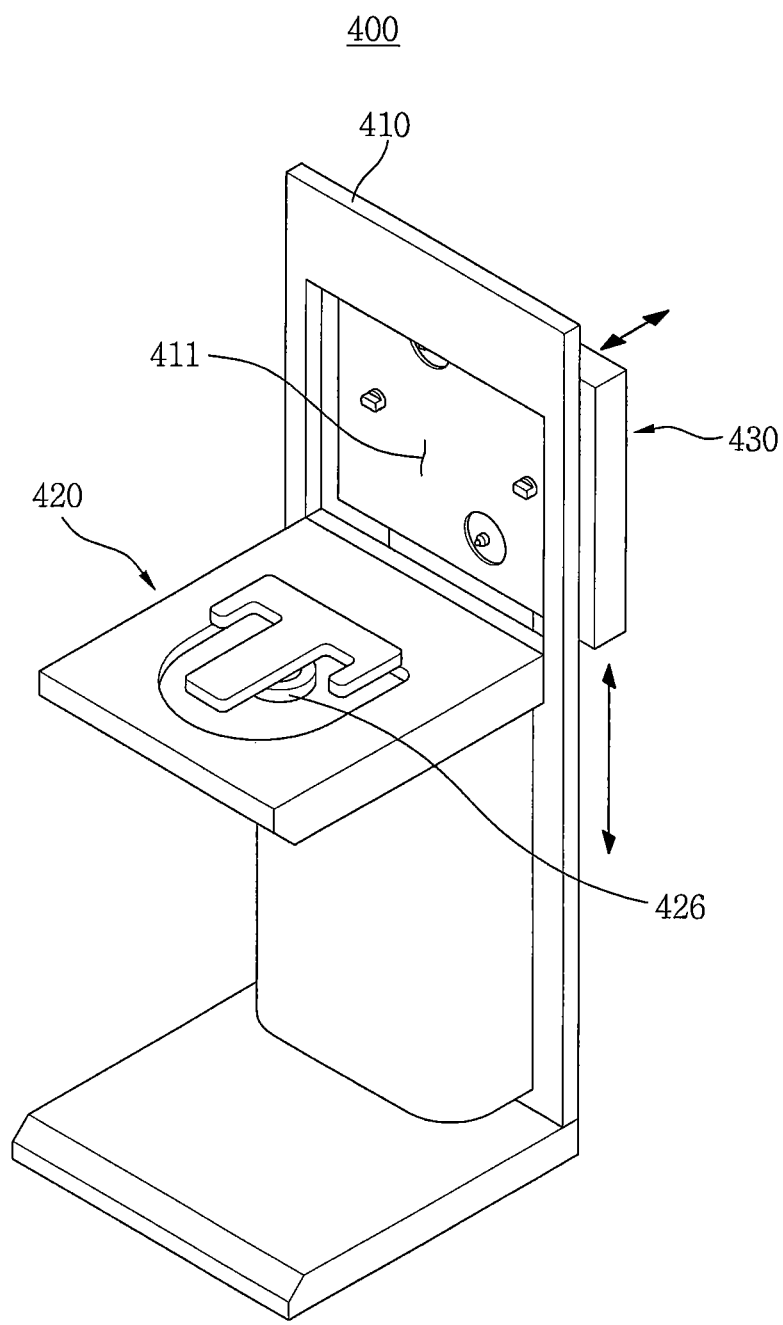
FIG. 6B is a schematic 3D view of the outlet port when viewed from the inside of the body frame.

FIG. 6A is a schematic 3D view of an outlet port 400 when viewed from the outside thereof in accordance with some embodiments of the inventive concepts. FIG. 6B is a schematic 3D view of the outlet port 400 when viewed from the inside thereof.

Referring to FIGS. 6A and 6B, the outlet port 400 in accordance with some embodiments of the inventive concepts may include a frame module 410, a stage module 420, a door module 430, and a door module controller 440.

The frame module 410 may include an opening 411 through which the wafer shipping box 10 or a wafer passes.

The wafer shipping box 10 may be loaded on the stage module 420. The wafer shipping box 10 loaded on the stage module 420 may be provided to the rail-guided vehicles 651 to 653 through the opening 411.

The door module 430 is installed at an outer side of the frame module 410 and may be moved forward/backward or upward/downward by the door module controller 440. For example, the door module 430 may be moved forward toward the stage module 420, adhere to the door 15 of the wafer shipping box 10 by vacuum suction, lock/unlock the door 15 of the wafer shipping box 10 using the door locks 18 of the door 15, and move backward to separate the door 15 from the case 11 of the wafer shipping box 10. The door module 430 may be moved downward to expose the wafer shipping box 10 loaded on the stage module 420 through the opening 411.

The door module controller 440 may be installed on an outer surface of the frame module 410, and coupled to the door module 430 to move the door module 430 forward/backward or upward/downward. The door module controller 440 may include a spiral shaft coupled to a lower portion of the door module 430 to extend downward, and a driver for moving the spiral shaft upward/downward, e.g., a female screw. Otherwise, the door module controller 440 may include a rack and a pinion gear.

Figure 6C:
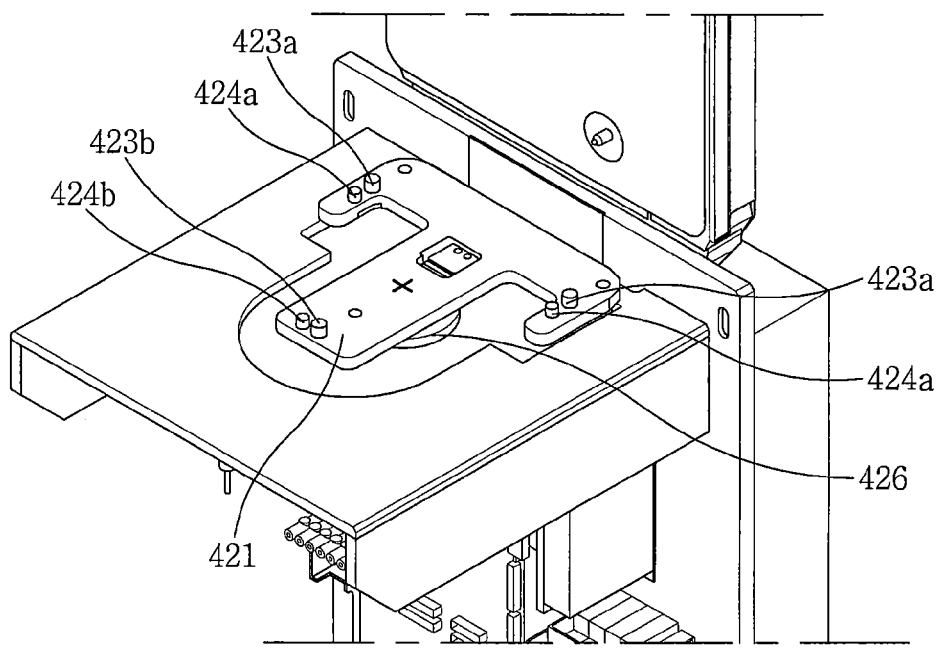
FIG. 6C is a schematic 3D view of a stage module in accordance with some embodiments of the inventive concepts.

FIG. 6C is a schematic 3D view of the stage module 420 in accordance with some embodiments of the inventive concepts. Referring to FIG. 6C, the stage module 420 may include a stage plate 421, front/rear stage support pins 423a and 423b, and front/rear stage sensors 424a and 424b.

The wafer shipping box 10 may be mounted on the stage plate 421. The stage plate 421 may have the same shape as the shelf plate 211 or the inlet plate 311 in some embodiments.

The front/rear stage support pins 423a and 423b may be installed on the stage plate 421. The front/rear stage support pins 423a and 423b may guide and support the loaded wafer shipping box 10 to be at a normal or desired position. The front/rear stage support pins 423a and 423b may protrude and/or otherwise be arranged to be inserted into the second sub-grooves 13g2 of the front/rear supports 13a and 13b of the case 11 of the wafer shipping box 10. For example, the front stage support pins 423a may be aligned to be inserted into the second sub-grooves 13g2 of the front supports 13a, and the rear stage support pins 423b may be aligned to be inserted into the second sub-grooves 13g2 of the rear support 13b.

The front/rear stage sensors 424a and 424b may be installed on the stage plate 421 adjacent to the front/rear stage support pins 423a and 423b, respectively. The front/rear stage sensors 424a and 424b may include a contact sensor.

The stage module 420 may further include a rotation driver 426 for rotating the stage plate 421. The rotation driver 4326 may cause the wafer shipping box 10 loaded on the stage plate 421 to be arranged or oriented such that the rear surface of the case 11 or the door 15 is exposed through the opening 411.

Figure 6D:
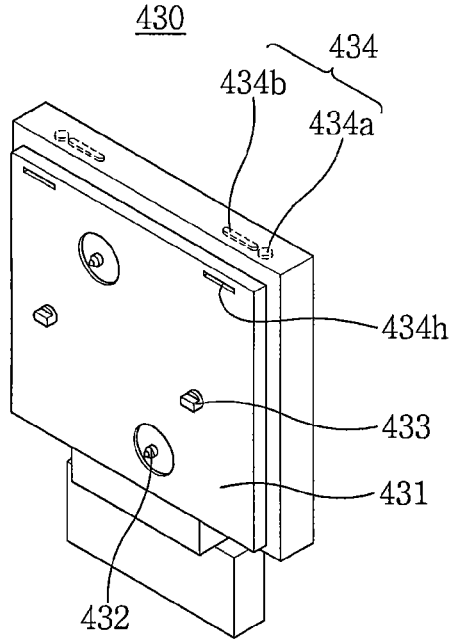
FIG. 6D is a schematic 3D view of a door module in accordance with some embodiments of the inventive concepts.

FIG. 6D is a schematic 3D view of the door module 430 in accordance with some embodiments of the inventive concepts. Referring to FIG. 6D, the door module 430 may include a cover plate 431, a pin assembly 432, a latch key 433, and a mapping module 434.

The cover plate 431 may be opened or closed through the opening 411.

The pin assembly 432 may be installed on an inner surface of the cover plate 431, and arranged to be aligned with the pin hole 16 of the door 15 of the wafer shipping box 10. The pin assembly 432 may be aligned and combined with the pin hole 16 of the door 15 of the wafer shipping box 10 to adhere to the door 15 of the wafer shipping box 10 by vacuum suction.

When the latch key 433 is inserted into, combined with, and rotated in the key hole 18b of the door lock 18 of the door 15 of the wafer shipping box 10, the rotor 18a may rotate to lock or unlock the door lock 18.

The mapping module 434 may include a rotation unit 434a and a mapping arm 434b. The mapping module 434 may be disposed in the door module 430. When the door module 430 is moved upward/downward by the door module controller 440, the rotation unit 434a may rotate to extend or stretch out the mapping arm 434b to pass through a cover hole 434h so that the inside of the wafer shipping box 10 may be scanned to map stacked wafers.

Figure 6E:
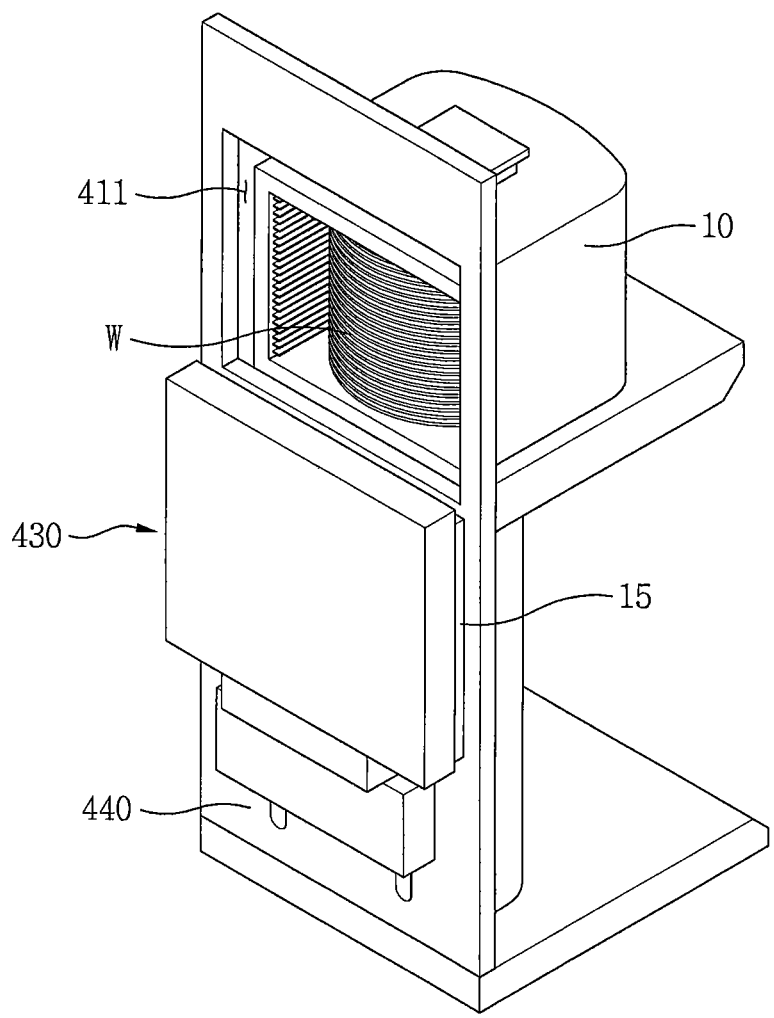
FIG. 6E is a diagram illustrating a state in which a door of a wafer shipping box is opened after the wafer shipping box is loaded on a stage plate.

FIG. 6E is a diagram illustrating a state in which the door 15 is opened after the wafer shipping box 10 is loaded on the stage plate 421. In the state, the door module 430 is moved downward while grabbing the door 15 of the wafer shipping box 10. Wafers W loaded in the wafer shipping box 10 are seen through the opening 411. The rail-guided vehicles 651, 652, and 653 may transfer the wafer shipping box 10 or transfer each of the wafers W loaded in the wafer shipping box 10, at a time.

Figure 6F:
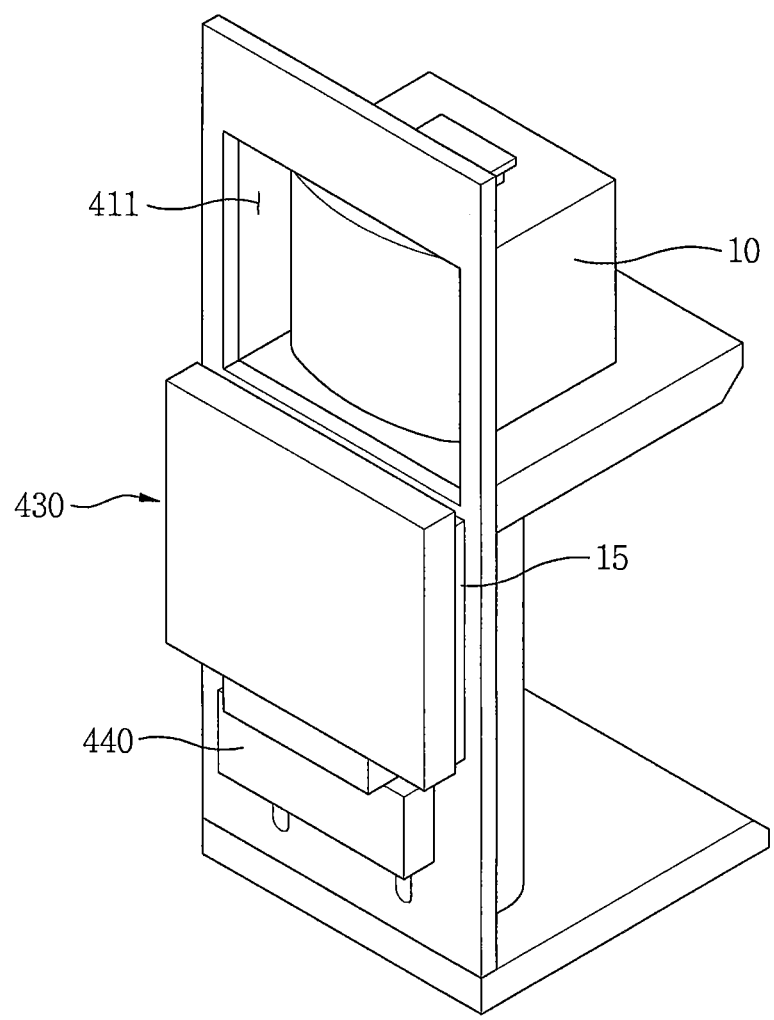
FIG. 6F is a diagram illustrating a state in which after a wafer shipping box is loaded on a stage plate, a rotation driver rotates the stage plate to expose a rear surface of a case of the wafer shipping box through an opening.

FIG. 6F is a diagram illustrating a state in which after the wafer shipping box 10 is loaded on the stage plate 421, the rotation driver 426 rotates the stage plate 421 to expose the rear surface of the case 11 of the wafer shipping box 10 through the opening 411. The rail-guided vehicles 651, 652, and 653 may transfer the wafer shipping box 10.

Figure 7A:
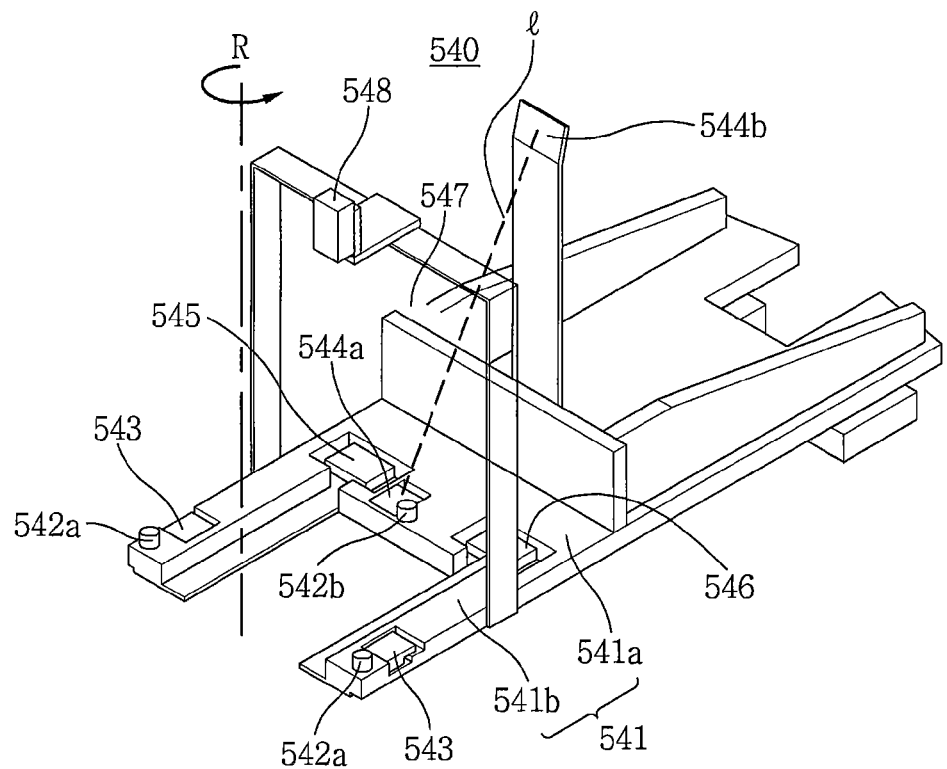
FIG. 7A is a schematic 3D view of a robot arm of a crane in accordance with some embodiments of the inventive concepts.
Figure 7B:
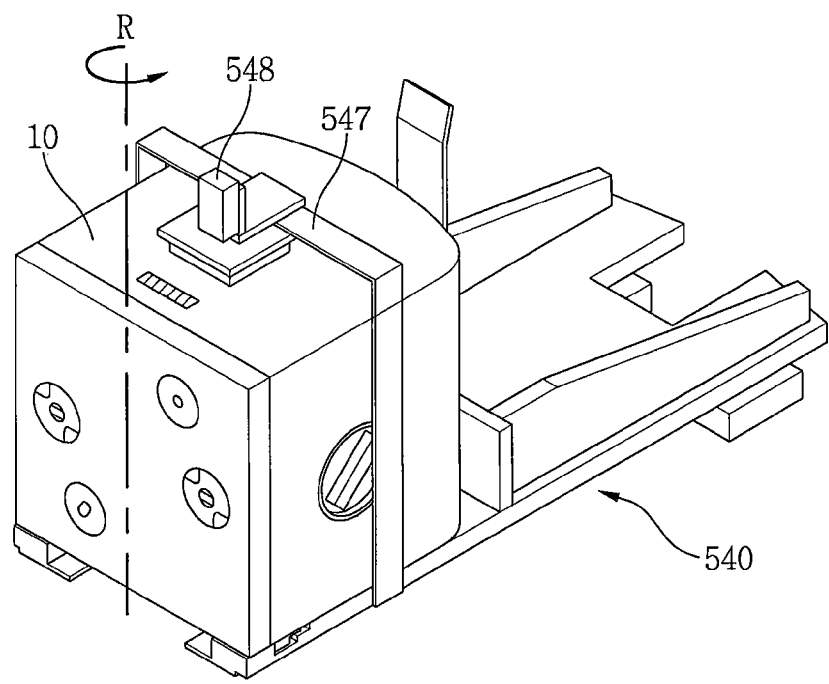
FIG. 7B is a schematic 3D view of the robot arm on which the wafer shipping box is loaded.

FIG. 7A is a schematic 3D view of a robot arm 540 of a crane 500 in accordance with some embodiments of the inventive concepts. FIG. 7B is a schematic 3D view of the robot arm 540 on which the wafer shipping box 10 is loaded.

Referring to FIG. 7A, the robot arm 540 may include a plate 541, front/rear support pins 542a and 542b, loading sensors 543, an optical sensor 544a, a reflective panel 544b, an auto-teaching sensor 545, a loading checking sensor 546, a cage 547, and an ID reader/writer 548.

The wafer shipping box 10 may be loaded on the plate 541. The plate 541 may include a plate body 541a and fork type plate legs 54 lb.

The front/rear support pins 542a and 542b may be installed on the plate 541. For example, the front support pin 542a may be disposed on the plate leg 541b and the rear support pin 542b may be disposed on the plate body 541a to be inserted into the first sub-grooves 13g1 of the wafer shipping box 10.

The loading sensors 543 may be installed on the plate 541 and may determine whether the wafer shipping box 10 is loaded on the plate 541. The loading sensors 543 may include a contact sensor.

The optical sensor 544a may be provided in the form of a module including a light-emitting device and a light-receiving element. Light emitted from the light-emitting device may be incident on the reflective panel 544b, and the reflective panel 544b may reflect the light to the light-receiving element of the optical sensor 544a. An optical path l of the optical sensor 544a and the reflective panel 544b may pass through the loaded wafer shipping box 10. Thus, whether the wafer shipping box 10 is loaded may be sensed by determining whether the light emitted from the light-emitting device is received by light-receiving element. The reflective panel 544b may be installed on the plate leg 541b.

The auto-teaching sensor 545 may be provided in the form of a module including a light-emitting device and a light-receiving element, and installed on the plate 541 such that it is optically aligned with the auto-teaching reflective panel 213 of the shelf 210 and an optical path thereof is not blocked by the wafer shipping box 10 loaded on the plate 541. In the auto-teaching sensor 545, the light-emitting device may radiate light to the auto-teaching reflective panel 213 and the light-receiving element may receive the light reflected from the auto-teaching reflective panel 213.

The loading checking sensor 546 may be provided in the form of a module including a light-emitting device and a light-receiving element, and installed on the plate 541 such that it is optically aligned with the upper loading checking reflective panel 214 or the lower loading checking reflective panel 215 and an optical path thereof is not blocked by the wafer shipping box 10 loaded on the plate 541. The light-emitting device of the loading checking sensor 546 may radiate light to the upper loading checking reflective panel 214 and/or the lower loading checking reflective panel 215, and the light-receiving element may receive the light reflected from the upper loading checking reflective panel 214 and/or the lower loading checking reflective panel 215.

The cage 547 may support the wafer shipping box 10 loaded on the plate 541. For example, the wafer shipping box 10 loaded on the plate 541 may be inserted into the cage 547 and may be thus stably mounted on the plate 541 even when the robot arm 540 moves or rotates.

The ID reader/writer 548 may be installed on an upper portion of the cage 547 to read ID information of the wafer shipping box 10 recorded on the ID tag 12 of the wafer shipping box 10 and/or to write new ID information of the wafer shipping box 10 to the ID tag 12. The ID reader/writer 548 may include an RFID reader/writer.

The robot arm 540 may rotate about a rotation axis R. The rotation axis R may be disposed near the door 15 of the wafer shipping box 10 or may be virtually disposed outside the door 15. That is, when the robot arm 540 on which the wafer shipping box 10 is mounted rotates, a centrifugal force is applied toward the case 11 and away from the door 15 of the wafer shipping box 10. Thus, even when the robot arm 540 rotates, wafers present in the wafer shipping box 10 do not lean toward the door 15. Thus, the wafers do not fall out of the wafer shipping box 10 even when the door 15 of the wafer shipping box 10 is open.

Figure 8A:
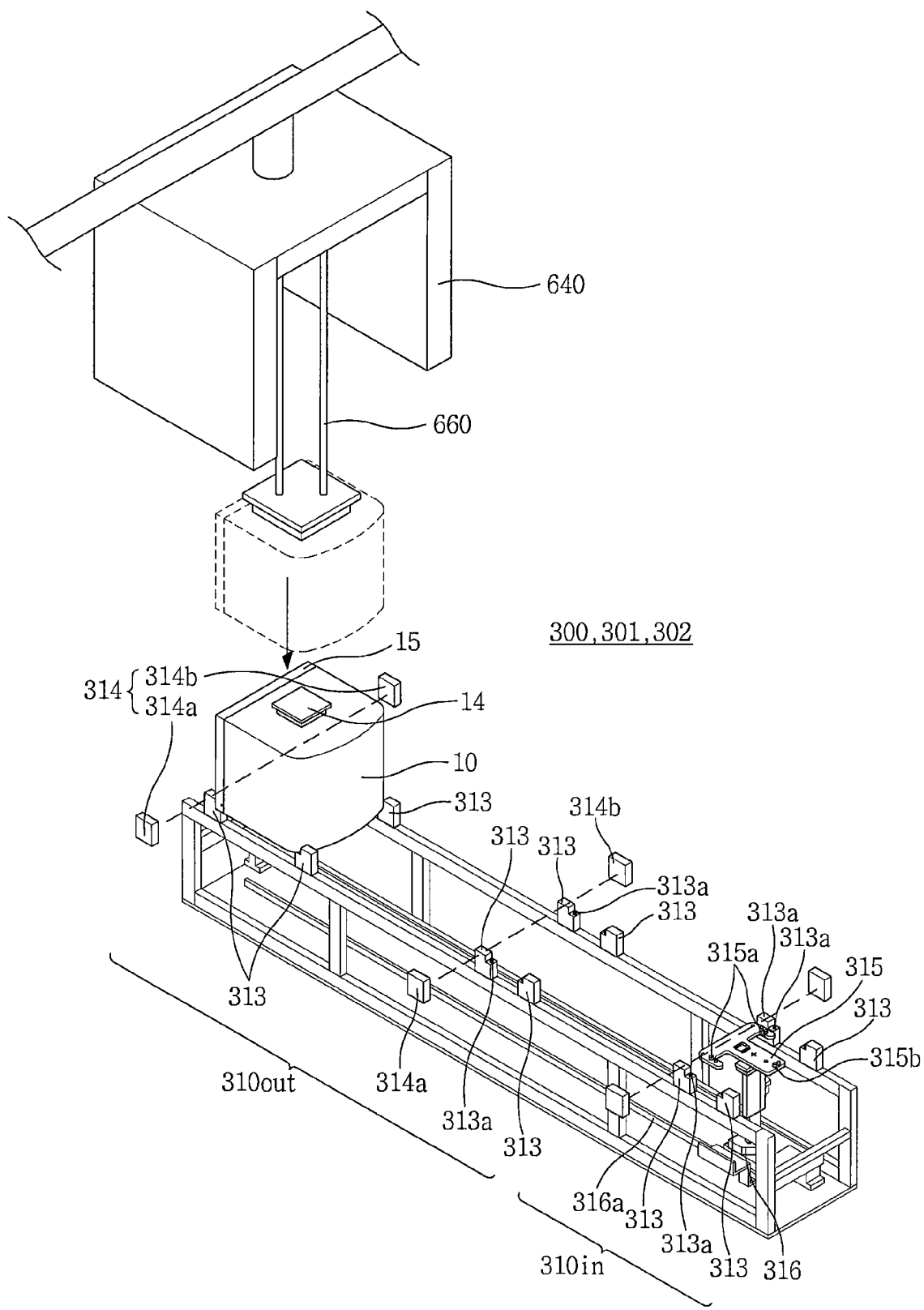
FIGS. 8A to 8C are diagrams illustrating loading/unloading of the wafer shipping box on the inlet port of the stocker by an overhead transfer vehicle in a stocker system in accordance with embodiments of the inventive concepts.
Figure 8B:
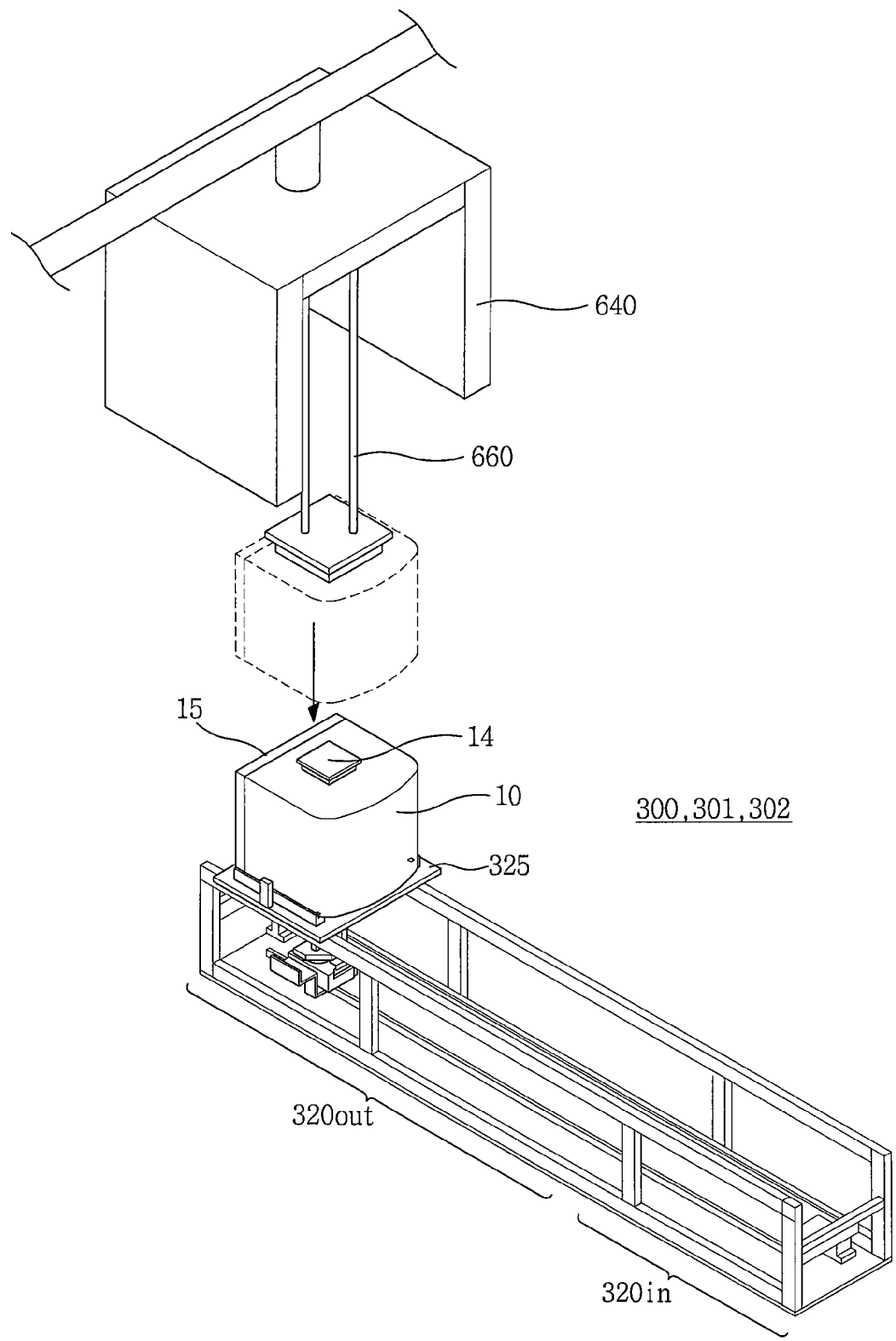
Figure 8C:
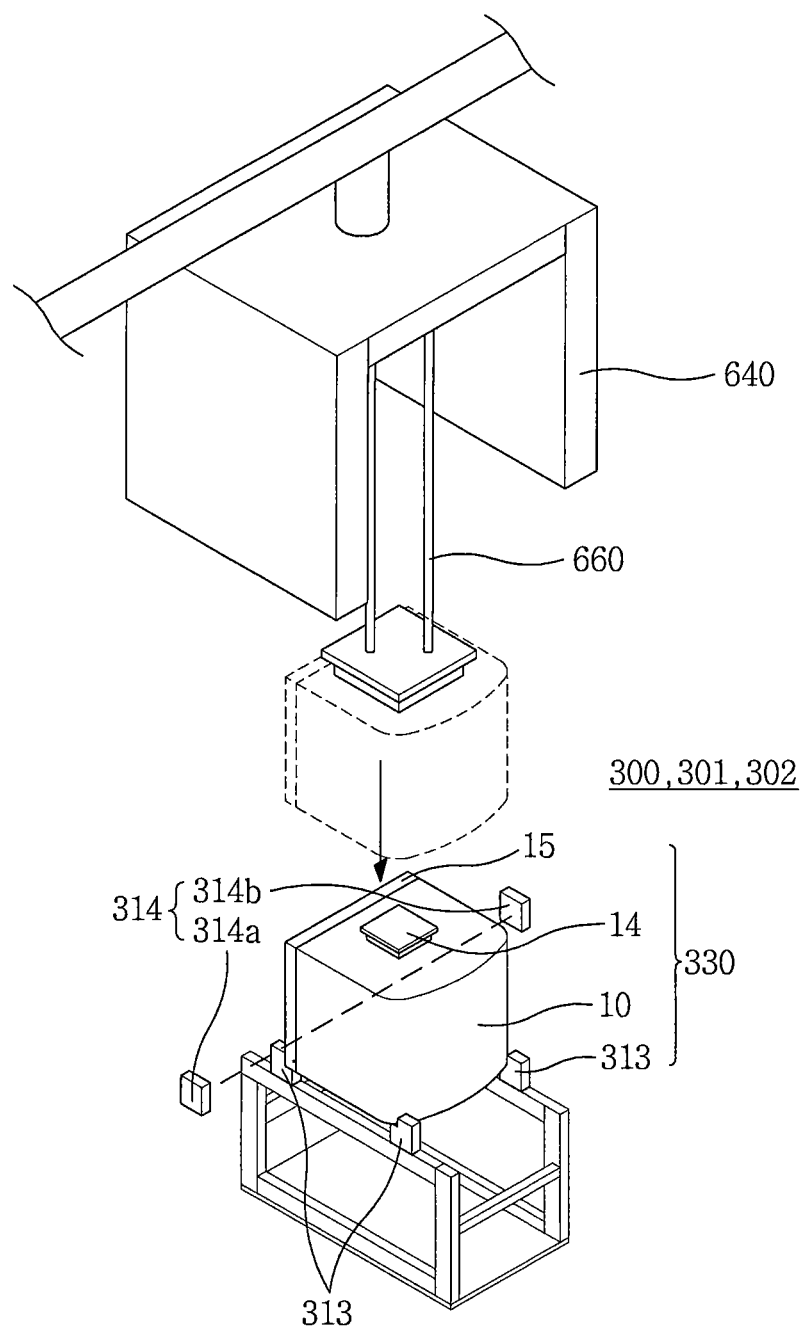

FIGS. 8A to 8C are diagrams illustrating loading/unloading of the wafer shipping box 10 on the inlet port 301 of the stocker 1000 by a overhead transfer vehicle 640 in a stocker system in accordance with embodiments of the inventive concepts.

Referring to FIGS. 8A to 8C, the overhead transfer vehicle 640 may move the wafer shipping box 10 upward/downward using a hoist 660 to be loaded on or unloaded from the inlet port 300A, 300B, or 300C. The overhead transfer vehicle 640 may include an OHT. The wafer shipping box 10 may be mounted on the inlet port 301 such that the door 15 faces an outer side of or away from the body frame 100.

Referring to FIG. 8A, when the wafer shipping box 10 is loaded on the guide pins 313 of the outer loading unit 310out, the loading plate 315 is moved to the bottom of the wafer shipping box 10 loaded on the guide pins 313 and moved upward to load the wafer shipping box 10 thereon, and then moved to the inside of the body frame 100. In some embodiments, wafer shipping box 10 may be directly moved downward and loaded on the inner loading unit 310in from the overhead transfer vehicle 640.

Referring to FIG. 8B, after the movable loading plate 325 is moved to the outer loading region 320out, the wafer shipping box 10 is loaded on the movable loading plate 325 from the overhead transfer vehicle 640, and the movable loading plate 325 may be moved to the inner loading region 320in in the body frame 100.

Referring to FIG. 8C, the wafer shipping box 10 may be directly loaded on the fixed loading unit 330 from the overhead transfer vehicle 640.

Figure 9A:
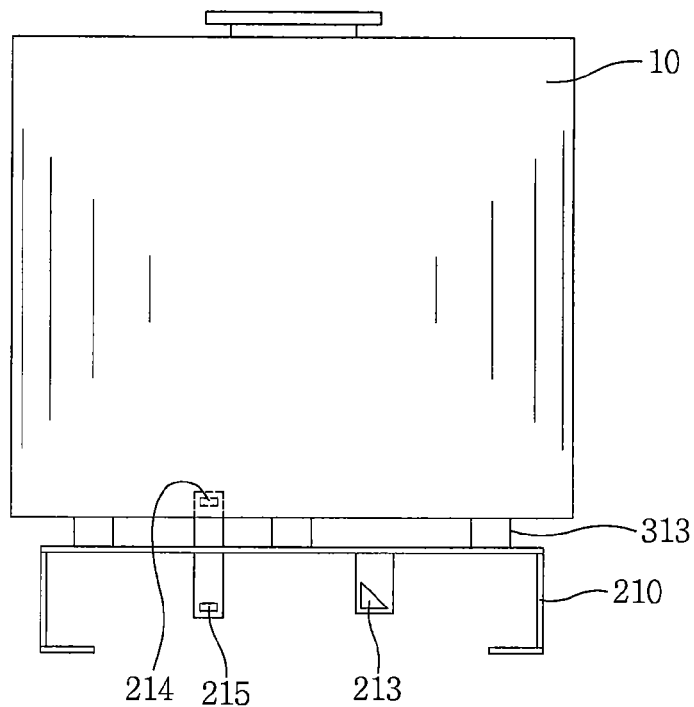
FIGS. 9A and 9B are diagrams illustrating methods of determining whether a wafer shipping box is loaded on a shelf and methods of determining and guiding a position of a crane in accordance with embodiments of the inventive concepts.
Figure 9B:
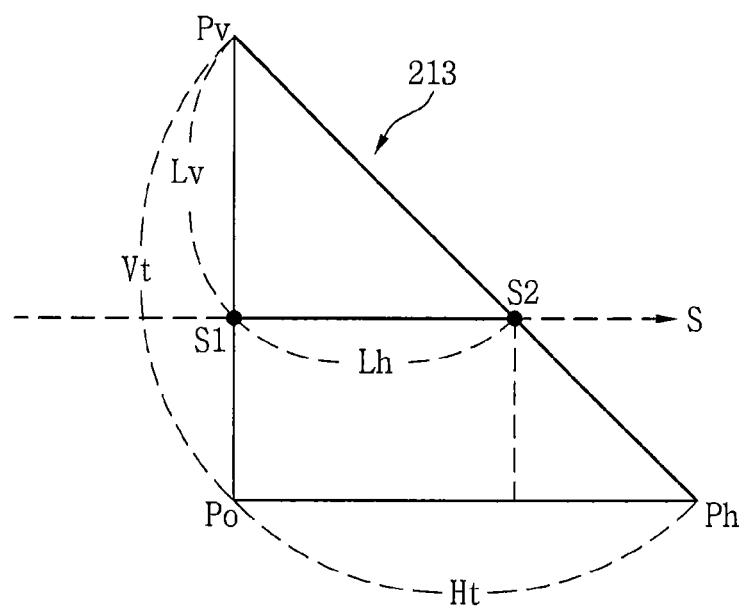

FIGS. 9A and 9B are diagrams illustrating methods of determining whether the wafer shipping box 10 is loaded on the shelf 210 and methods of determining and guiding the crane 500 to a normal or desired position in accordance with embodiments of the inventive concepts.

Referring to FIG. 9A, the method of determining whether the wafer shipping box 10 is loaded on the shelf 210 may first include moving the robot arm 540 of the crane 500 to optically align the loading checking sensor 546 with the upper loading checking reflective panel 214 of the shelf 210. Thereafter, the method may include radiating light to the upper loading checking reflective panel 214 of the shelf 210 using the light-emitting device of the loading checking sensor 546.

Case 1. When light reflected from the upper loading checking reflective panel 214 is received by the light-receiving element of the loading checking sensor 546, it may be determined that the wafer shipping box 10 is not loaded on the shelf 210.

Case 2. When light reflected from the upper loading checking reflective panel 214 is not received by the light-receiving element of the loading checking sensor 546, it may be determined that the wafer shipping box 10 is loaded on the shelf 210 or the location of the robot arm 540 of the crane 500 is incorrect.

Case 2 may include moving the robot arm 540 of the crane 500 such that the loading checking sensor 546 is optically aligned with the lower loading checking reflective panel 215. Thereafter, Case 2 may include radiating light to the lower loading checking reflective panel 215 of the shelf 210 using the light-emitting device of the loading checking sensor 546.

Case 2-1. When light reflected from the lower loading checking reflective panel 215 is received by the light-receiving element of the loading checking sensor 546, it may be determined that the wafer shipping box 10 is loaded on the shelf 210 and the location of the robot arm 540 of the crane 500 is correct.

Case 2-2. When light reflected from the lower loading checking reflective panel 215 is not received by the light-receiving element of the loading checking sensor 546, it may be determined that the location of the robot arm 540 of the crane 500 is incorrect regardless of whether the wafer shipping box 10 is loaded on the shelf 210.

A process of determining the relation between the locations of the shelf 210 and the robot arm 540 of the crane 500 may be performed before and/or after determining whether the wafer shipping box 10 is loaded on the shelf 210 is determined.

Referring to FIG. 9B, the method of determining and guiding the crane 500 to a normal or desired position may first include scanning the auto-teaching reflective panel 213 in a horizontal direction (or a vertical direction) by radiating light to the auto-teaching reflective panel 213 of the shelf 210 using the light-emitting device of the auto-teaching sensor 545 of the robot arm 540. As described above, the auto-teaching reflective alignment panel 213 may have a right-angle isosceles triangular shape (also referred to as an isosceles right triangle shape). In detail, this method may include scanning the auto-teaching reflective panel 213 in one direction, e.g., the horizontal direction, and measuring a horizontal length Lh between a start point S1 and an end point S2 of scanning the auto-teaching reflective panel 213 in a scan path S. Since the auto-teaching reflective panel 213 has the right-angled isosceles triangular shape, the horizontal length Lh is equal to a vertical length Lv between a vertical vertex Pv and the start point S1. Thus, if the accurate horizontal length and vertical length are preset when the crane 500 is at a normal or desired position, degrees of which the robot arm 540 of the crane 500 is shifted from the normal or desired position in the horizontal and vertical directions may be determined. For example, when vertices Po, Ph, and Pv are at a normal or desired position, the accurate length of the scan path S is preset and thus degrees (distances) to which of the crane 500 is shifted from the normal or desired position in the horizontal and vertical directions may be determined by scanning the auto-teaching reflective panel 213 only once.

Since the degrees to which the crane 500 is shifted from the normal or desired position in the horizontal and vertical directions may be determined, the location of the crane 500 may be corrected or the crane 500 may be moved to a normal or desired position.

A stocker and a transfer system according to the one or more embodiments of the inventive concepts may transfer an FOSB, an FOUP, a wafer, etc.

A stocker and a transfer system according to the one or more embodiments of the inventive concepts may employ one or both of an OHT and an OHS.

A stocker and a transfer system according to embodiments of the inventive concepts may load and transfer a wafer shipping box without changing a direction or orientation of the wafer shipping box.

A stocker and a transfer system according to the one or more embodiments of the inventive concepts can use RFID, and thus, up to a whole or entirety of the semiconductor manufacturing process may be managed using one ID tag without using a plurality of IDs.

In a stocker and a transfer system according to the one or more embodiments of the inventive concepts, a wafer shipping box may be transferred and loaded in a state in which a door of the wafer shipping box is closed, and the door of the wafer shipping box is opened only when each of wafers should be transferred at a time, thereby reducing a danger of polluting the wafers.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of the inventive concepts as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor wafer stocker apparatus, comprising:
a body frame;
an inlet port to load a wafer shipping box into the body frame;
an outlet port to unload the wafer shipping box from the body frame;
an automated transfer robot operable to convey the wafer shipping box between the inlet port and the outlet port; and
a shelf module within the body frame comprising a shelf plate that is configured to support the wafer shipping box, the shelf plate comprising:
a shelf body unit adjacent the body frame and including first and second support pins protruding therefrom; and
a plurality of shelf leg units extending from the shelf body unit away from the body frame, wherein a third support pin protrudes from one of the shelf leg units, wherein the first and second support pins are closer to the body frame than the third support pin, and
wherein the shelf plate further includes a reflective alignment panel on a surface thereof, wherein the reflective alignment panel is indicative of both a horizontal and vertical position of the automated transfer robot relative to the shelf plate.

2. The apparatus of claim 1, wherein the first, second, and third support pins are arranged to align with respective grooves in an underside of the wafer shipping box and orient the wafer shipping box with a door thereof facing away from the body frame, and wherein the reflective alignment panel comprises a shape such that a scan thereof is indicative of both the horizontal and vertical position of the automated transfer robot relative to the shelf plate.

3. The apparatus of claim 2, wherein the first, second, and third support pins are arranged in a triangular configuration in which the first and second support pins are equidistant from the body frame.

4. The apparatus of claim 2, wherein the surface of the shelf plate including the reflective alignment panel is opposite the first, second, and third support pins, wherein the shape of the reflective alignment panel comprises an isosceles right triangle shape such that the scan thereof is indicative of both the horizontal and vertical position of the automated transfer robot relative to the shelf plate.

5. The apparatus of claim 4, wherein the shelf plate further includes an upper load checking reflective panel on the surface thereof including the first, second, and third support pins, wherein the upper load checking reflective panel is indicative of a presence of the wafer shipping box on the shelf plate based on an absence of light reflected therefrom.

6. The apparatus of claim 5, wherein the shelf plate further includes a lower load checking reflective panel on the surface thereof opposite the first, second, and third support pins, wherein the lower load checking reflective panel is indicative of the presence of the wafer shipping box based on light reflected therefrom in combination with the absence of light reflected from the upper load checking reflective panel.

7. The apparatus of claim 2, wherein the inlet port comprises:
a top and/or side opening in the body frame;
an inner loading unit that is within the body frame;
an outer loading unit external to the body frame and that is configured to receive the wafer shipping box from an overhead transfer vehicle with the door thereof facing away from the body frame; and
a loading plate that is operable to move the wafer shipping box between the outer loading unit and the inner loading unit through the opening in the body frame while maintaining the door thereof facing away from the body frame.

8. The apparatus of claim 7, wherein the loading plate comprises protruding loading pins that are arranged to align with the respective grooves in the underside of the wafer shipping box and orient the wafer shipping box with the door thereof facing away from the body frame.

9. The apparatus of claim 1, wherein the automated transfer robot is operable to convey the wafer shipping box between the inlet port and the outlet port such that the door of the wafer shipping box faces away from the body frame at both the inlet port and the outlet port.

10. A semiconductor wafer stocker apparatus, comprising:
a body frame;
an inlet port comprising an opening in the body frame to load a wafer shipping box into the body frame such that a door of the wafer shipping box faces away from the body frame, wherein the opening in the body frame is positioned at a top and/or side of the body frame, the inlet port further comprising:
an inner loading unit that is within the body frame;
an outer loading unit that is external to the body frame and that is configured to receive the wafer shipping box from an overhead transfer vehicle; and
a loading plate operable to move the wafer shipping box between the outer loading unit and the inner loading unit such that the door thereof faces away from the body frame, wherein the loading plate comprises protruding loading pins that are arranged to align with respective grooves in an underside of the wafer shipping box such that the door thereof faces away from the body frame;
an outlet port to unload the wafer shipping box from the body frame; and
an automated transfer robot that is operable to convey the wafer shipping box between the inlet port and the outlet port.

11. The apparatus of claim 10, further comprising:
a shelf module within the body frame comprising a shelf plate that is configured to support the wafer shipping box, the shelf plate having support structures arranged to align with the respective grooves in the underside of the wafer shipping box such that the door thereof faces away from the body frame.

12. The apparatus of claim 11, wherein the loading pins and/or the support structures comprise first, second, and third support pins arranged in a triangular orientation, wherein the first and second support pins are closer to the body frame than the third support pin.

13. The apparatus of claim 10, wherein the automated transfer robot is operable to convey the wafer shipping box between the inlet port and the outlet port such that the door of the wafer shipping box faces away from the body frame at both the inlet port and the outlet port.

14. The apparatus of claim 13, wherein the inlet port is configured to receive the wafer shipping box from the overhead transfer vehicle with the door in a closed position and facing away from the body frame, and wherein the automated transfer robot is operable to convey the wafer shipping box to the outlet port while maintaining the door in the closed position.

15. The apparatus of claim 14, wherein the outlet port to unload the wafer shipping box from the body frame comprises a door module that is operable to move the door of the wafer shipping box to an open position prior to unloading of the wafer shipping box from the apparatus.

16. The apparatus of claim 15, wherein the outlet port further comprises a stage module that is configured to receive the wafer shipping box from the automated transfer robot with the door thereof facing away from the body frame, the stage module comprising a stage plate having protruding stage support pins arranged to align with the respective grooves in the underside of the wafer shipping box.

17. The apparatus of claim 16, wherein the stage module comprises a rotation driver that is operable to rotate the wafer shipping box such that the door faces toward the body frame after the door is in the open position and prior to the unloading thereof.

\* \* \* \* \*